(12) United States Patent
Wagner et al.

(10) Patent No.: US 11,990,408 B2
(45) Date of Patent: May 21, 2024

(54) WLCSP RELIABILITY IMPROVEMENT FOR PACKAGE EDGES INCLUDING PACKAGE SHIELDING

(71) Applicant: Intel Corporation, Santa Clara, CA (US)

(72) Inventors: Thomas Wagner, Regelsbach (DE); Jan Proschwitz, Riesa (DE)

(73) Assignee: Intel Corporation, Santa Clara, CA (US)

( * ) Notice: Subject to any disclaimer, the term of this patent is extended or adjusted under 35 U.S.C. 154(b) by 863 days.

(21) Appl. No.: 16/833,169

(22) Filed: Mar. 27, 2020

(65) Prior Publication Data

US 2021/0305158 A1 Sep. 30, 2021

(51) Int. Cl.
*H01L 23/528* (2006.01)
*H01L 23/00* (2006.01)
*H01L 23/522* (2006.01)
*H01L 23/552* (2006.01)

(52) U.S. Cl.
CPC ...... *H01L 23/5283* (2013.01); *H01L 23/5226* (2013.01); *H01L 23/552* (2013.01); *H01L 23/562* (2013.01); *H01L 24/16* (2013.01); *H01L 24/94* (2013.01); *H01L 2224/16227* (2013.01)

(58) Field of Classification Search
CPC ............. H01L 23/5283; H01L 23/5226; H01L 23/552; H01L 23/562; H01L 24/16; 24/94; H01L 2224/16227; H01L 2224/02381; H01L 2224/04105; H01L 2224/05548; H01L 2224/0401; H01L 2224/05558; H01L 2224/05559; H01L 2224/05572; H01L 2224/06051; H01L 2224/12105; H01L 2924/10156; H01L 2924/10157; H01L 2224/02373; H01L 2224/13008
USPC ........................................................ 257/659
See application file for complete search history.

(56) References Cited

U.S. PATENT DOCUMENTS

| | | | |
|---|---|---|---|
| 2008/0006910 A1* | 1/2008 | Miyata | H01L 23/293 438/114 |
| 2010/0207281 A1* | 8/2010 | Su | H01L 21/563 257/786 |
| 2017/0250158 A1* | 8/2017 | Chinnusamy | H01L 23/3107 |
| 2019/0006288 A1* | 1/2019 | Wang | H01L 21/6835 |

(Continued)

*Primary Examiner* — Nduka E Ojeh
*Assistant Examiner* — Laura M Dykes
(74) *Attorney, Agent, or Firm* — Schwabe, Williamson & Wyatt, P.C.

(57) ABSTRACT

Embodiments disclosed herein include electronic packages. In an embodiment, an electronic package comprises a redistribution layer (RDL) having a conductive layer in a first dielectric layer, and a second dielectric layer over the conductive and first dielectric layers. The RDL comprises an extended portion having a first thickness that vertically extends from a bottom surface of the first dielectric layer to a topmost surface of the second dielectric layer. The electronic package comprises a die on the RDL, where the die has sidewall surfaces, a top surface, and a bottom surface that is opposite from the top surface, and an active region on the bottom surface of the die. The first thickness is greater than a second thickness of the RDL that vertically extends from the bottom surface of the first dielectric layer to the bottom surface of the die. The extended portion is over and around the sidewall surfaces.

16 Claims, 17 Drawing Sheets

(56) References Cited

U.S. PATENT DOCUMENTS

2020/0075519 A1\* 3/2020 Lin ..................... H01L 23/3171
2021/0210538 A1\* 7/2021 Lai .................... H01L 27/14618

\* cited by examiner

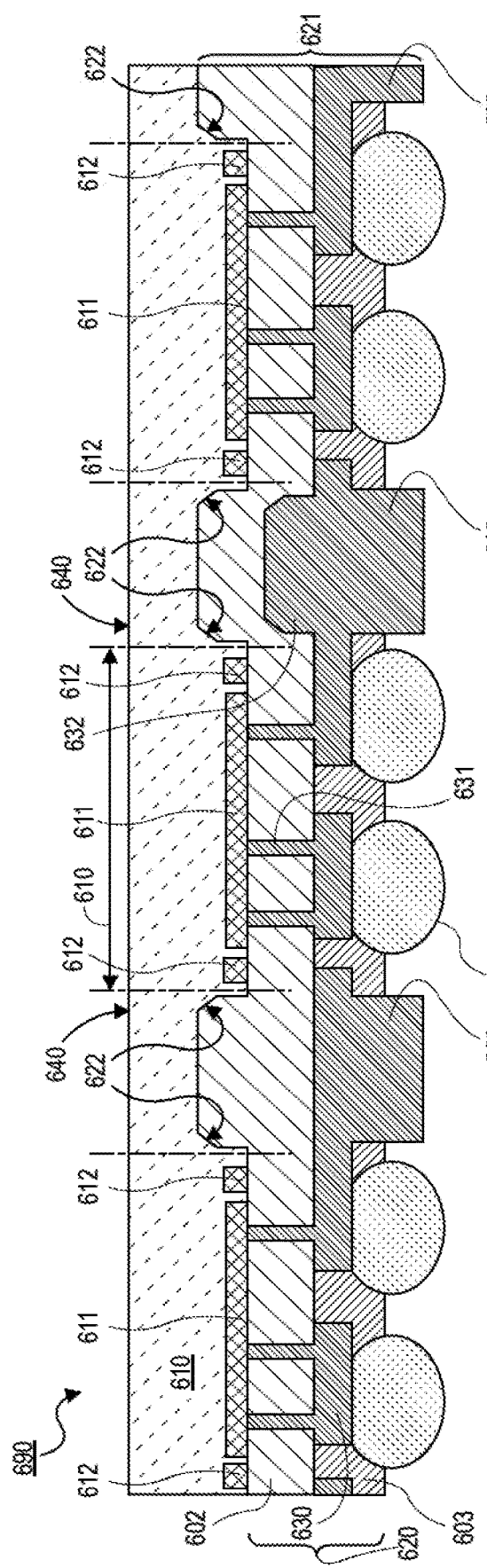
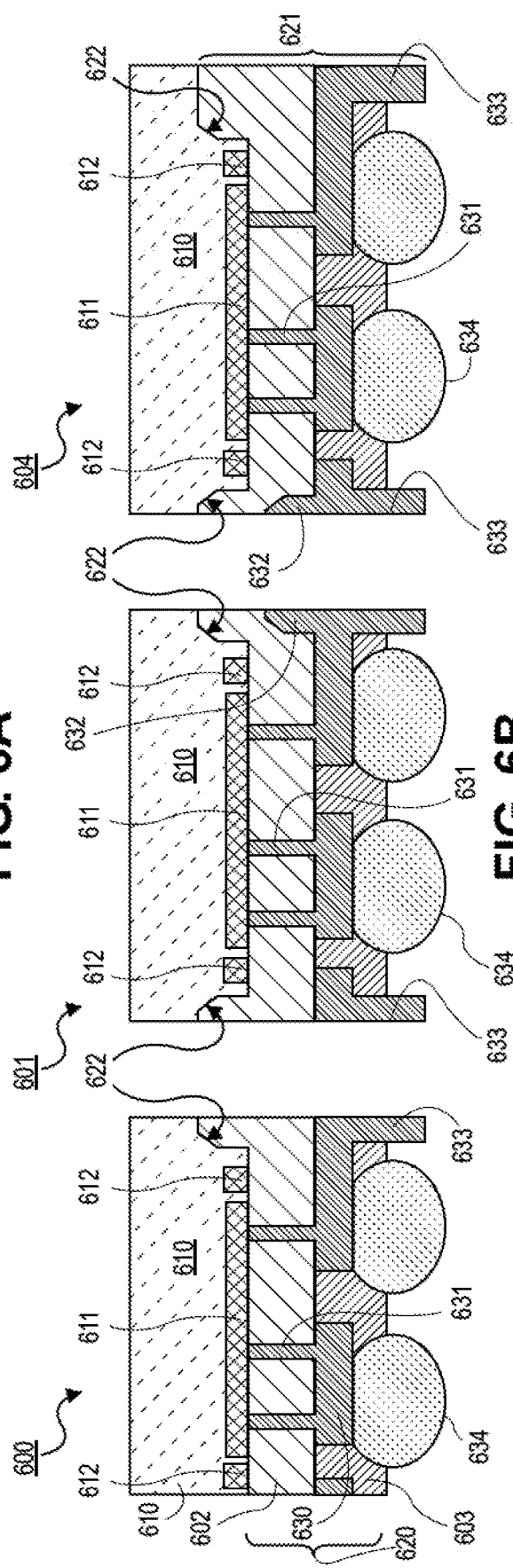
FIG. 6A
FIG. 6B

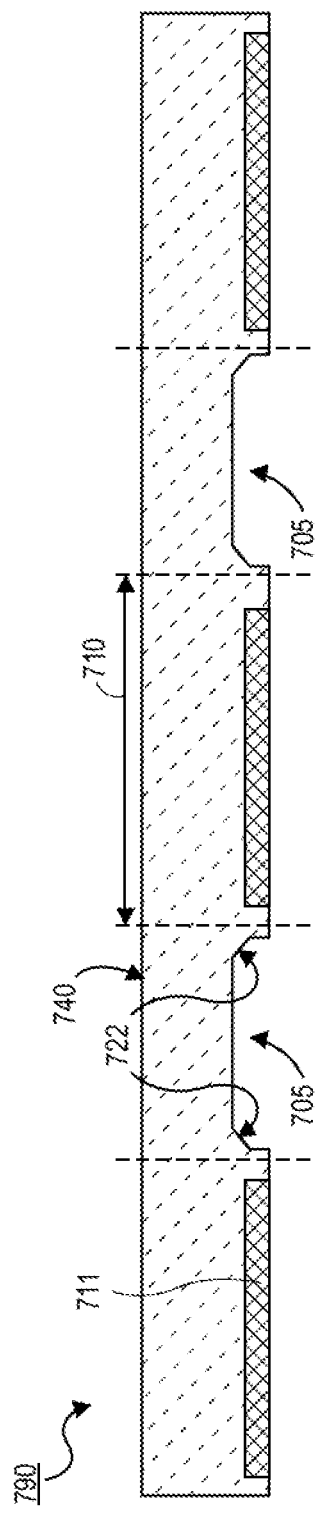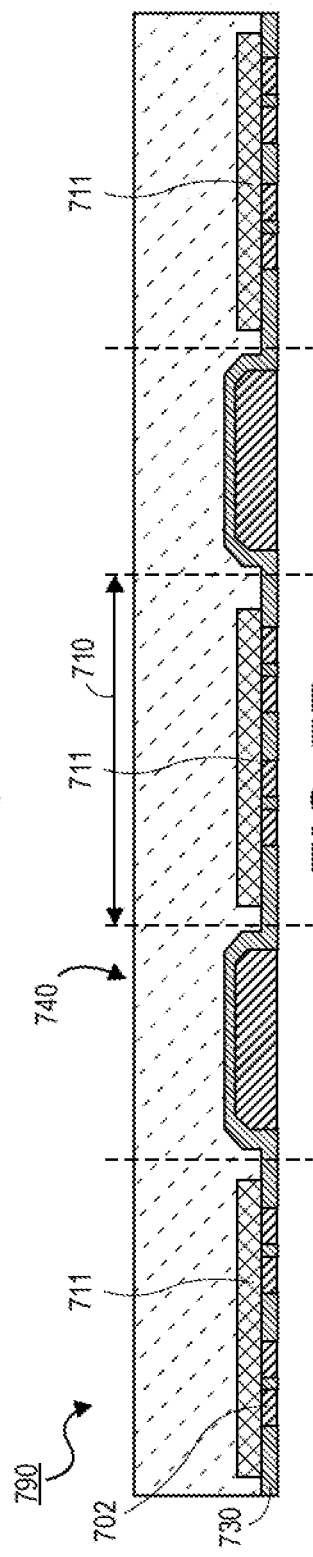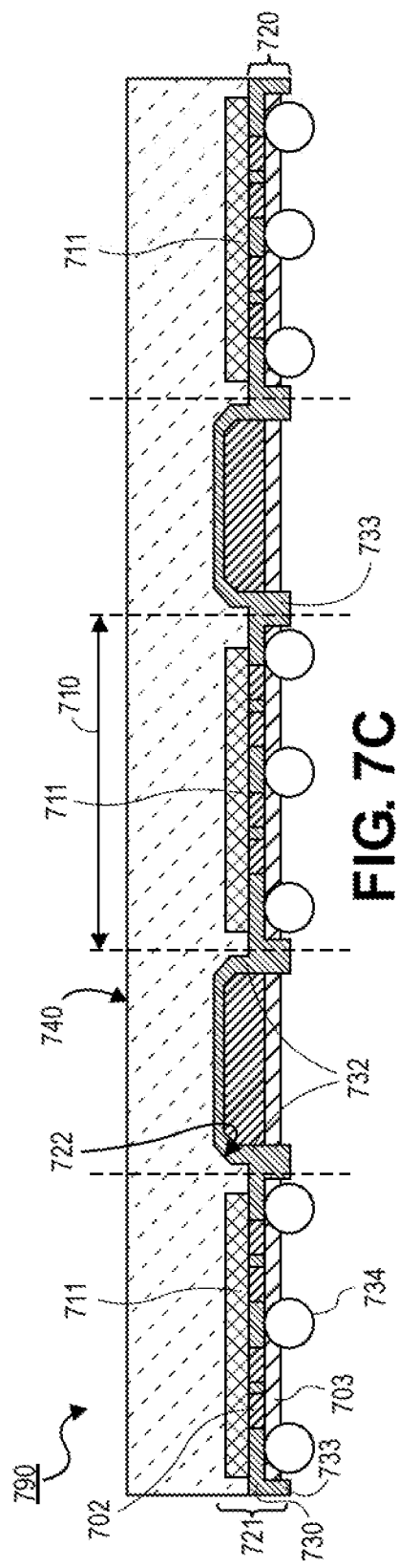

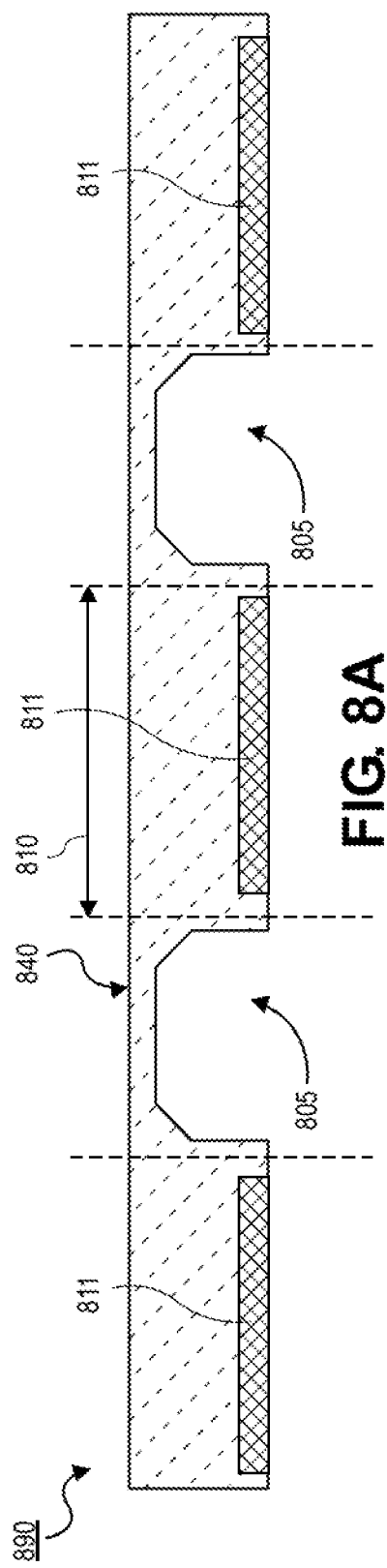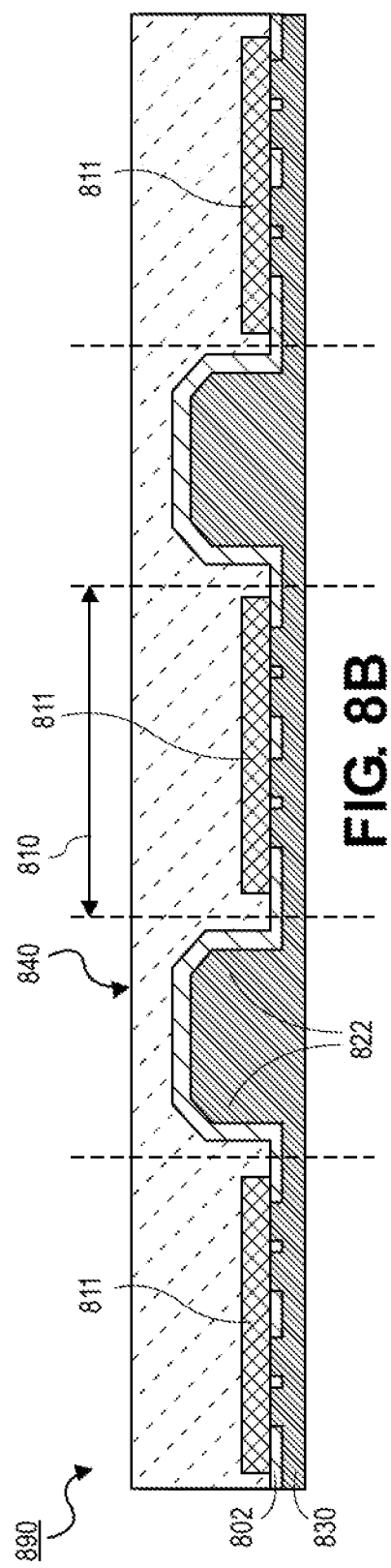

US 11,990,408 B2

WLCSP RELIABILITY IMPROVEMENT FOR PACKAGE EDGES INCLUDING PACKAGE SHIELDING

TECHNICAL FIELD

Embodiments of the present disclosure relate to semiconductor devices, and more particularly to wafer level packaging architectures with active die regions that are surrounded by extended redistribution layer (RDL) structures.

BACKGROUND

The demand for miniaturization of form factor and increased levels of integration for high performance are driving sophisticated packaging approaches in the semiconductor industry. One such approach is to use wafer level packaging architectures to enable miniaturization of small form factor and high performance. Such architectures generally depend on a singulation process to dice out target dies on a wafer. For example, such singulation processes have been implemented to dice out wafer level chip scale packages (WLCSPs), which are considered one of the smallest packages available in the existing industry. However, such wafer level packaging architectures also have their own integration challenges.

One challenge is that wafer level packages suffer from extremely sensitive mechanical assembly processes and subsequent back end of line (BEOL) applications. This challenge is mainly due to wafer level packages having unprotected or exposed surfaces and regions. Particularly, such wafer level packages have exposed active die regions (e.g., the periphery regions on the bottom surface and/or sidewalls) that have unprotected silicon from the BEOL active area, and that are excessively sensitive to assembly yield loss and reliability issues such as humidity and/or thermo-mechanical stresses.

Another challenge is that the wafer level packages suffer from micro cracks in the exposed active silicon regions that are typically generated during the singulation process. Such micro cracks, however, are often not detected during manufacturing and assembly processes. Implementing a crack stop structure in the wafer level package has been proposed to reduce the micro crack propagation. Likewise, special singulation processes have also been proposed to decrease the risk of generating serious micro cracks, such as a laser pre-cut process prior to a blade dicing process.

Other wafer level packaging technologies such as flip-chip chip scale packages (FCCSPs) have implemented subsequent assembly processes to cover the critical active areas with underfill and/or mold materials. However, as additional processes and materials are required, the FCCSPs also have their own integration challenges such as longer assembly times, greater manufacturing costs, higher robustness, and increased substrate area. Other challenges are that the FCCSPs particularly suffer from thermo-mechanical stresses during on board assemblies and temperature/humidity issues in the field that force micro crack propagations.

Accordingly, the wafer level packaging structures and processes have not significantly reduced nor avoided such micro crack propagations, which ultimately result in functional failures for the end devices. The existing packaging technologies, therefore, negate the benefits provided by the wafer level packages, and are not desirable solutions.

BRIEF DESCRIPTION OF THE DRAWINGS

FIGS. 6A-6B are a series of cross-sectional illustrations that depict a process to implement one or more electronic packages with a die, a RDL, and an extended RDL portion with one or more conductive contacts and/or one or more conductive pillars, in accordance with some embodiments.

FIGS. 7A-7D are a series of cross-sectional illustrations that depict a process to implement an electronic package with a die, a RDL, an extended RDL portion with one or more conductive contacts and/or conductive pillars, and a package substrate, in accordance with some embodiments.

FIGS. 8A-8D are a series of cross-sectional illustrations that depict a process to implement one or more electronic packages with a die, a RDL, and an extended RDL portion with one or more conductive traces, in accordance with some embodiments.

EMBODIMENTS OF THE DETAILED DESCRIPTION

Figure 1A:
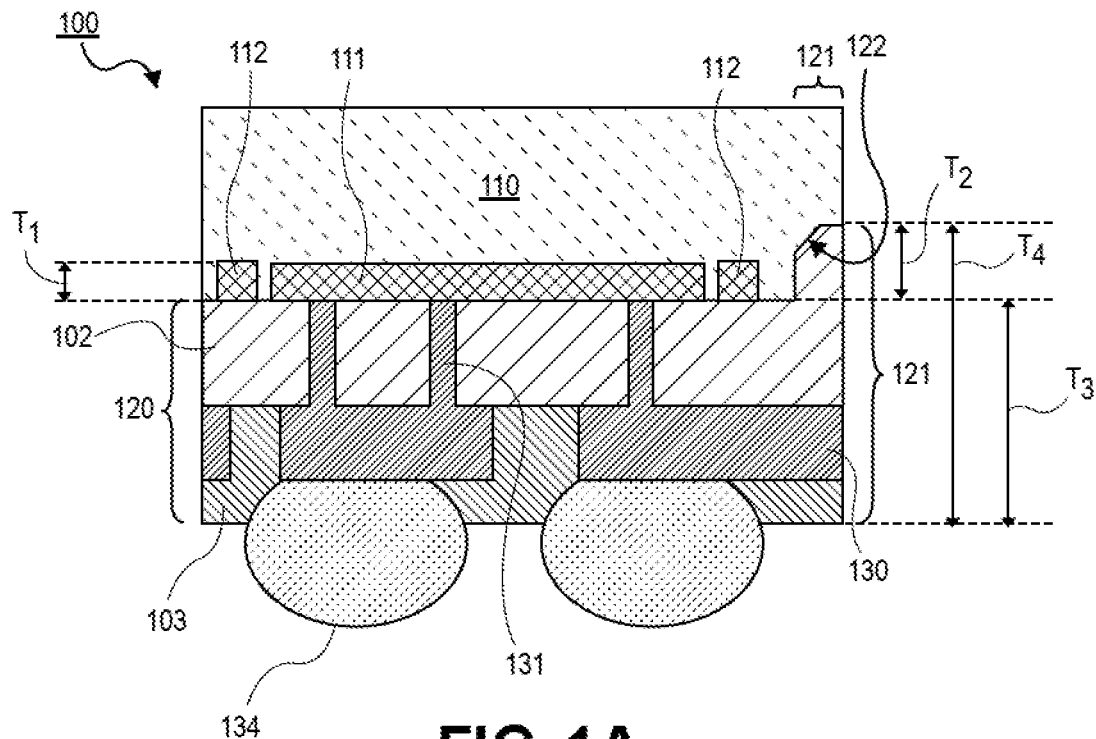
FIG. 1A is a cross-sectional illustration of an electronic package comprising a die, a redistribution layer (RDL), and an extended RDL portion, in accordance with an embodiment.

Described herein are electronic packages with active die regions that are protected with extended redistribution layer (RDL) structures, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, current packaging solutions are beginning to use wafer level packaging architectures. However, the existing wafer level packaging architectures are not without issues. For example, such wafer level packages suffer from poor assembly yield and reliability. Particularly, the unprotected surfaces and exposed regions located around the active die regions (and at the periphery of the active die regions) are extremely sensitive to thermo-mechanical stresses, humidity, mechanical assembly process issues, and other subsequent back end of line (BEOL) applications. As such, additional and complicated assembly processing steps have been proposed to add protection layers or screening and detecting measures (e.g., infrared (IR) inspection), which attempt to protect or identify manufacturing fails at such unprotected surfaces and/or regions. However, the inclusion of additional assembly steps, materials, and equipment lead to lower yields, additional costs, increased reliability investigations and development time, and enlarged package substrate areas. Accordingly, embodiments described herein include electronic packages that utilize extended RDL structures to protect the exposed active die regions and further provide shielding connections.

Accordingly, the embodiments described herein include a die with an active region and a RDL having one or more extended RDL structures. Particularly, the extended RDL structures may comprise extended RDL portions, conductive pillars and/or rings, and conductive shields. The extended RDL portions are referred to as being "extended" because the RDL has seamless extensions that are enlarged over and around the exposed periphery regions of the active die. In other words, the active die may be centrally positioned on and entirely within a footprint of the RDL that results in unoccupied space on the RDL, where such unoccupied space of the RDL may be used as the extended portion. In the embodiments herein, the electronic packages may have an uninterrupted (or unbroken) dielectric protection layer in the critical BEOL active die region. For example, the exposed periphery regions may be singulated trench surfaces (or edges) that are located around the BEOL active die region. Such surfaces may be a part of a trench or the like implemented with a grooving process (e.g., laser, blade, or lithographic grooving) that directly patterns regions on the sidewall surfaces of the active die, where a thickness of the grooved regions is greater than a thickness of the active die region.

Accordingly, the seamless, extended RDL portions may be directly disposed over and around the exposed periphery regions that result from the singulated sidewall surfaces around the active die regions. The extended RDL portions may be implemented using the existing assembly process with a modified process flow order in combination with one or more RDL structures that are enlarged over the entire kerf area. The extend RDL portions provide one or more protection layers for wafer level packaging architectures to prevent micro cracks and/or at least substantially slow down the propagation of micro cracks for the life time of the devices. Furthermore, in some embodiments, the extend RDL portions enable optimal electrical connections to any package shield by extending the conductive interconnects (e.g., pads, traces, or the like) to have one or more exposed surfaces at the side(s) of the electronic package. Accordingly, the embodiments allow for more robustness against thermo-mechanical stresses, humidity, and other mechanical assembly steps, such as dicing, handling, testing and on board assembly. As such, the embodiments described herein allow for high yields and reliability, lower platform costs, denser product designs, and reduced packaging materials and reliability measures.

Referring now to FIG. 1A, a cross-sectional illustration of an electronic package 100 is shown, in accordance with an embodiment. In an embodiment, the electronic package 100 may be any type of wafer level packages. For example, the electronic package 100 may be a WLCSP, fan-in wafer level package (FI-WLP), or the like. In an embodiment, the electronic package 100 may be combined with any other chip scale packaging architectures (e.g., flip-chip chip scale package (FCCSP) or the like). Also, while a single extended RDL portion 121 on a single sidewall surface of the die 110 is shown in FIG. 1A for simplicity, it is to be appreciated that any number of extended RDL portions 121 may be disposed on any of the sidewall surfaces of the die 110.

In some embodiments, the electronic package 100 may comprise a die 110 and a RDL 120. The die 110 may be disposed over the RDL 120. The die 110 may have sidewall surfaces, a top surface, and a bottom surface that is opposite from the top surface. In the illustrated embodiment, the bottom surface of the die 110 may be directly disposed on a top surface of the RDL 120. Additionally, in such illustrated embodiments, a plurality of solder balls 134 (or solder bumps) may be disposed on a bottom surface of the RDL 120 that is opposite from the top surface of the RDL 120. For example, the solder balls 134 may electrically couple conductive pads of the RDL 120 to a package substrate (e.g., a printed circuit board (PCB)), an interposer, or the like. The use of the RDL 120 to provide metallization interconnects (e.g., first-level interconnects (FLIs)) that electrically couple the solder balls 134 to active devices (e.g., transistors, etc.) on the bottom surface of the die 110 will be described in greater detail below.

In an embodiment, the die 110 may be any type of dies. For example, the die 110 may be a semiconductor die, an electronic device (e.g., a wireless device), an integrated circuit (IC), a central processing unit (CPU), a graphic processing unit (GPU), a microprocessor (or processor), a platform controller hub (PCH), a memory (e.g., a high bandwidth memory (HBM)), a field-programmable gate array (FPGA), or the like. In some embodiments, the die 110 may have an active region 111 and a crack stop component 112. In an embodiment, the active region and crack stop component 111-112 may have a thickness $T_1$.

In an embodiment, the active region 111 may be positioned on the bottom surface of the die 110. In an embodiment, the active region 111 may comprise an active surface that is electrically coupled to the RDL 120. In some embodiments, the active region 111 may comprise any type of active devices (and in other embodiments any type of active and/or passive devices). For example, the active region 111 may comprise circuitry, transistors, or the like that are suitable for processing signals. The active region 111 serves as a BEOL area of active devices that are stacked on top of each other.

In the illustrated embodiments, the crack stop component 112 may also be positioned on the bottom surface of the die 110. Particularly, in an embodiment, the crack stop component 112 may be positioned on a region of the bottom surface of the die 110 that is around the active region 111. In some embodiments, the crack stop component 112 may be positioned on a periphery region of the bottom surface of the die 110. In an embodiment, the crack stop component 112 may be implemented as a picture-frame structure or the like that surrounds the active region 111. Accordingly, in some embodiments, the crack stop component 112 may be separated from the active region 111 by portions of the die 110 (e.g., silicon bulk or the like).

As described above, the die 110 may have one or more trenched regions 122. In an embodiment, the trenched regions 122 may be positioned on one or more of the sidewall surfaces of the die 110. In some embodiments, the trench regions 122 (or trench-shaped regions) may be directly patterned into at least one or more bottom ends of the sidewall surfaces of the die 110. That is, the trench regions 122 may be positioned around one or more periphery regions of the bottom surface of the die 110 (e.g., one or more corner edges of the bottom surface of the die 110). For example, the trench regions 122 may be positioned on each of the four sidewall surfaces of the die 110. However, in the illustrated embodiment, a single trench region 122 is shown on the right-sidewall surface of the die 110. However, it is to be appreciated that embodiments may include any number of trench regions 122 and patterned into any of the sidewall surfaces of the die 110. Examples of multiple trench regions 122 are provided below in greater detail.

As noted above, in some embodiments, the trench regions 122 may be a part of a trench, a groove, or the like implemented by a grooving process or the like. For example, the grooving process may use a laser, a blade, an etch (e.g., a chemical wet etch), or the like to directly pattern a trench that is subsequently singulated into the trench regions 122 on the sidewall surfaces of the die 110. In some embodiments, the trench regions 122 may have a thickness $T_2$. In an embodiment, the thickness $T_2$ of the trench regions 122 may be greater than the thickness $T_1$ of the active region and crack stop component 111-112. Examples of the grooving processes used to form the trench regions 122 are provided below in greater detail.

In some embodiment, the RDL 120 may comprise one or more extended RDL portions 121, a plurality of vias 131, a conductive layer 130, and one or more dielectric layers 102-103. In an embodiment, the conductive layer 130 may be disposed in the dielectric layer 103. In an embodiment, the dielectric layer 102 may be disposed over the conductive layer 130 and the dielectric layer 103. In an embodiment, the RDL 120 may have a thickness $T_3$. As shown in FIG. 1A, the thickness $T_3$ may be defined from a bottom surface of the dielectric layer 103 to the bottom surface of the die 110. The vias 131 may extend through the dielectric layer 102. In an embodiment, the vias 131 may vertically extend from a top surface of the conductive layer 130 to the bottom surface of the die 110. In some embodiments, the vias 131 may electrically couple the solder balls 134 and conductive layer 130 to the active region 111 of the die 110.

The conductive layer 130 may be any type of conductive interconnects. For example, the conductive layer 130 may comprise copper pads, traces, lines, planes, or the like that may be electrically coupled to the solder balls 134, the vias 131, and so on (e.g., conductive shields, pillars, rings, etc.). The vias 131 may be any type of via interconnects with any type of shapes (e.g., through silicon vias (TSVs), lithographically-defined vias, etc.). In the illustrated embodiment, a single conductive layer 130 with vias 131 is shown in the RDL 120. However, it is to be appreciated that the RDL 120 may comprise any number of conductive layers 130 with any number of stacked vias 131. Also, in the illustrated embodiment, the vias 131 are shown as having substantially vertical sidewall profiles. Such an embodiment may be provided when the via openings are lithographically defined. However, it is to be appreciated that embodiments may also comprise vias 131 with tapered sidewall profiles. Such embodiments are typically formed when the via openings are formed with a laser drilling process.

In some embodiments, the dielectric layers 102-103 may be a buildup film, a solder resist layer (e.g., a solder mask), a photo-imageable dielectric (PID), an epoxy material, or any other dielectric materials. In an embodiment, the dielectric layers 102-103 may include the same dielectric materials. While, in other embodiments, the dielectric layer 102-103 may include different dielectric materials. For example, the dielectric layer 103 may be a solder resist layer, and the dielectric layer 102 may be a buildup film. Also, in the illustrated embodiment, two dielectric layers 102-103 are shown in the RDL 120. However, it is to be appreciated that embodiments may include any number of dielectric layers 102-103 in the RDL 120 (e.g., a single dielectric layer or greater than two dielectric layers).

As noted above, the RDL 120 may comprise one or more extended RDL portions 121. In the illustrated embodiment, the one or more extended RDL portions 121 are shown over and around the trench regions 122 of the die 110. Particularly, the extended RDL portions 121 are shown to extend laterally beyond the periphery regions on the bottom surface of the die 110 (i.e., the bottom corner edges of the die 110), and also to extend vertically to surround the bottom ends of the sidewall surfaces of the die 110. For example, the extended RDL portions 121 may vertically extend from the bottom surface of the dielectric layer 103 to the topmost surface of the dielectric layer 102 (i.e., the top surface of the trench region 122).

In the illustrated embodiment, the extended RDL portions 121 are shown as having semi-trench-like sidewall profiles (or semi-grooved sidewall profiles) at the top ends. However, it is to be appreciated that embodiments may also comprise extended RDL portions 121 with substantially sidewall profiles, tapered sidewall profiles, or the like. Examples of multiple extended RDL portions 121 with such profiles are provided below in greater detail.

In the illustrated embodiment, the extended RDL portions 121 may have a thickness $T_4$ that overlaps the thickness $T_1$ of the active region 111. In an embodiment, the thickness $T_4$ may be substantially greater than the thickness $T_1$. In an embodiment, the thickness $T_4$ may be approximately equal to the sum of thickness $T_3$ of the RDL 120 and thickness $T_2$ of the trench region 122. While, in other embodiments, the extended RDL portions 121 may have a thickness that is greater than the sum of the thickness $T_3$ of the RDL 120 and thickness $T_2$ of the trench region 122 (e.g., as shown below in FIGS. 2A-2B). Furthermore, the RDL 120 and extended RDL portions 121 may have a combined footprint that is greater than a footprint of the bottom surface of the die 110. For example, the footprint of the bottom surface of the die 110 may be entirely within the combined footprint of the RDL 120 and extended RDL portions 121.

Accordingly, since the extended RDL portions 121 are directly disposed in the trench region 122 and/or on the sidewall surfaces of the die 110, the extended RDL portions 121 serves as a direct, seamless extension of the RDL 120 that provides one or more additional protective barriers for the active region 111. That is, in an embodiment, the extended RDL portions 121 may use a portion of the dielectric layer 102 to serve as an additional protective layer for the BEOL active area of the die 110 by entirely surrounding the trench regions 122 and the thickness $T_1$ of the active region 111. For example, the extended RDL portions 121 enlarge the space (or width) between the outer sidewall surfaces of the active region 111 and the outer exposed sidewall surfaces of the electronic package 100, without the need for additional protective layers such as mold and underfill layers that negatively impact wafer level packaging architectures.

In the illustrated embodiment, the extended RDL portion 121 is shown as a stack of portions respectively comprising of the dielectric layer 102, the dielectric layer 103, and the conductive layer 130. However, in some embodiments, it is to be appreciated that the extended RDL portions 121 may comprise portions from only the dielectric layer 102 and the conductive layer 130. Whereas, in other embodiments, it is to be appreciated that the extended RDL portions 121 may comprise any number of portions of any number of dielectric layers 102-103 and conductive layers 130. Examples of multiple extended RDL portions 121 are provided below in greater detail.

Figure 1B:
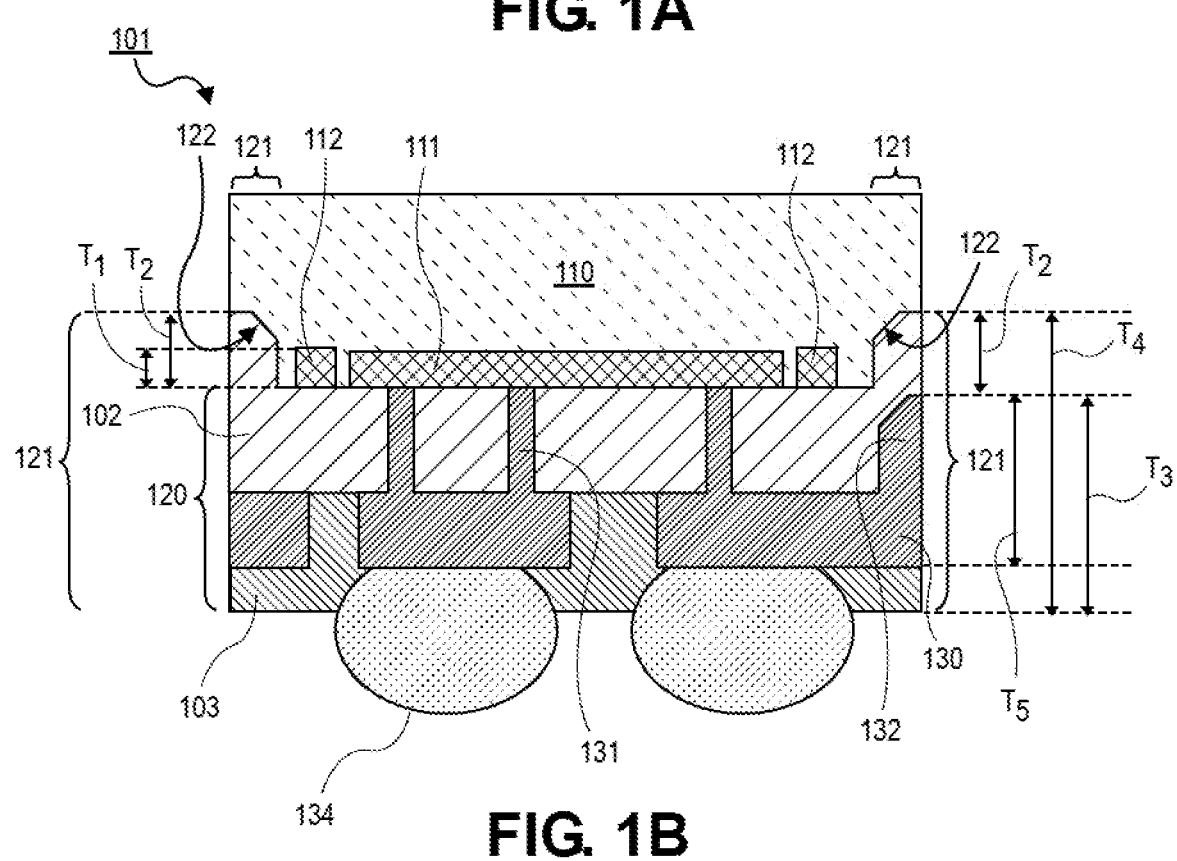
FIG. 1B is a cross-sectional illustration of an electronic package comprising a die, a RDL, and an extended RDL portion with conductive contacts, in accordance with an embodiment.

Referring now to FIG. 1B, a cross-sectional illustration of an electronic package 101 is shown, in accordance with an additional embodiment. In an embodiment, the electronic package 101 in FIG. 1B may be substantially similar to the electronic package 100 in FIG. 1A, with the exception that one of the extended RDL portions 121 may comprise one or more conductive contacts 132. In some embodiments, the conductive contacts 132 may electrically couple the RDL 120 and/or the active region 111 of the die 110 to any other electrical components. For example, such electrical components may include conductive shields, interconnects, or the like, as described below in greater detail. In an embodiment, the conductive contacts 132 may be any type of conductive extensions having exposed sidewall surfaces. In an embodiment, the conductive contacts 132 may be conductive plugs, trenches, grooves, pillars, or the like. As such, in some embodiments, the conductive contacts 132 may have slanted (or tapered) surfaces, rounded surfaces, grooved surfaces (i.e., surfaces of a portion of a trench), substantially vertical surfaces, or the like.

In some embodiments, the exposed sidewall surfaces of the conductive contacts 132 may have a thickness $T_5$ that enhances the electrical connections for the RDL 120. For example, the thickness $T_5$ may provide larger exposed surface areas for the conductive contacts 132 to have optimal electrical connections with any type of conductive shields, interconnects, or the like. In some embodiments, the conductive contacts 132 may be directly patterned in the RDL 120 to expose one or more active edges that may thus enable optimal electrical connections for any type of package shielding architectures.

In the illustrated embodiment, the thickness $T_5$ may be less than the thickness $T_3$ of the RDL 120. However, in other embodiments, the thickness $T_5$ may be approximately equal to or greater than the thickness $T_3$ of the RDL 120. For example, the thickness $T_5$ may be greater than a thickness of the sidewall surfaces of the die 110, where the thickness vertically extends from the bottom surface to the top surface of the dies 110. Note that such examples of conductive contacts 132 (or also referred to as conductive traces) are provided below in greater detail. Also, in the illustrated embodiment, the extended RDL portions 121 are shown to be disposed on each of the trench regions 122 of the die 110, while the electrical contact 132 is shown to be disposed on only one of the sidewall surfaces of the electronic package 101. However, it is to be appreciated that embodiments may include any number of extended RDL portions 121 with any number of electrical contacts 132 that may be disposed on any of the sidewall surfaces of the die 110 and the electronic package 101.

Figure 2A:
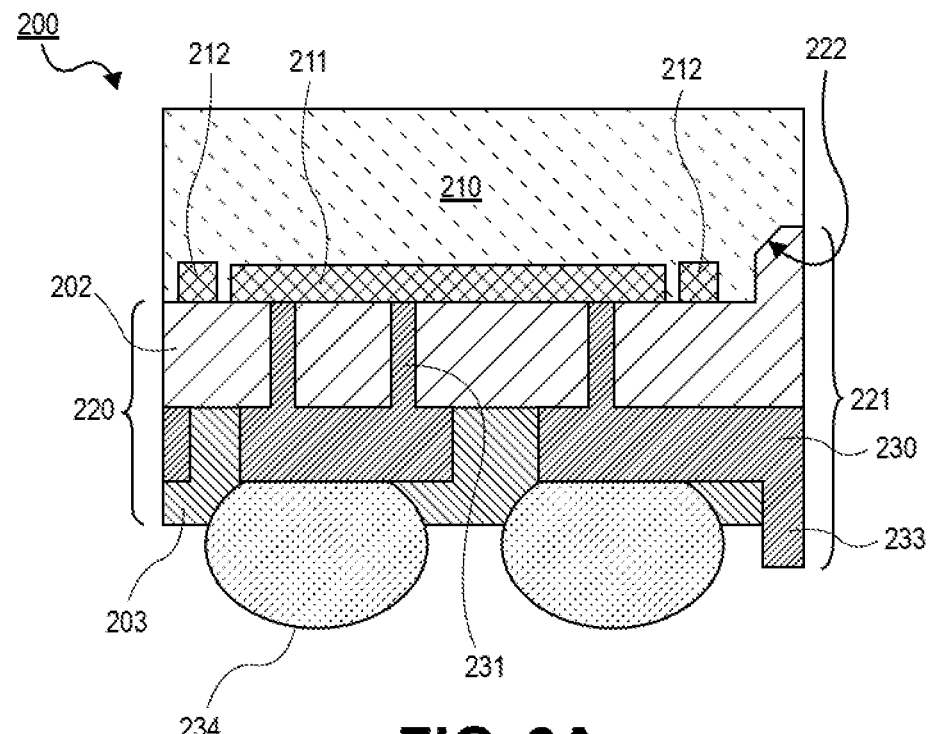
FIG. 2A is a cross-sectional illustration of an electronic package comprising a die, a RDL, and an extended RDL portion with conductive pillars, in accordance with an embodiment.

Referring now to FIG. 2A, a cross-sectional illustration of an electronic package 200 is shown, in accordance with an additional embodiment. In an embodiment, the electronic package 200 in FIG. 2A may be substantially similar to the electronic packages 100-101 in FIGS. 1A-1B, with the exception that one or more extended RDL portions 221 may comprise one or more conductive pillars 233. In some embodiments, the conductive pillars 233 may be coupled to a package substrate (or the like) to increase the solder joint reliability of the electronic package 200, without the need of any additional measures such underfill materials and so on. As noted above, the die 210 with the active region 211, crack stop component 212, and trench regions 222, and the RDL 220 with the conductive layer 230, vias 231, dielectric layers 202-203, extended RDL portions 221, and solder balls 234 in FIG. 2A may be substantially similar to the die 110 with the active region 111, crack stop component 112, and trench regions 122, and the RDL 120 with the conductive layer 130, vias 131, dielectric layers 102-103, extended RDL portions 121, and solder balls 134 in FIG. 1A.

In some embodiments, the conductive pillars 233 may be electrically coupled to any type of substrates by solder interconnects (e.g., solder paste). Particularly, the conductive pillars 233 may be disposed on and coupled to the periphery regions of such substrates. In an embodiment, the conductive pillars 233 may be any type of conductive interconnects with substantially vertical profiles. In some embodiments, the conductive pillars 233 may be positioned around the RDL 220 to form multiple patterned structures as shown below in FIGS. 2C-2D.

Figure 2B:
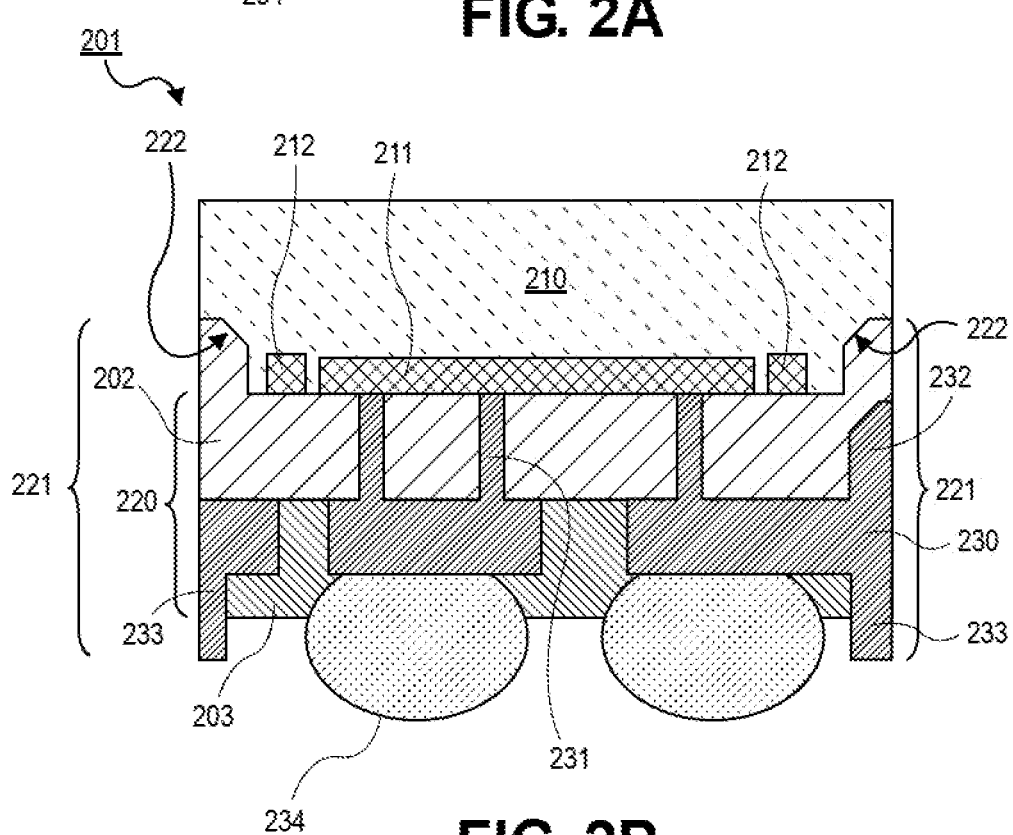
FIG. 2B is a cross-sectional illustration of an electronic package comprising a die, a RDL, and an extended RDL portion with conductive contacts and conductive pillars, in accordance with an embodiment.

Referring now to FIG. 2B, a cross-sectional illustration of an electronic package 201 is shown, in accordance with an additional embodiment. In an embodiment, the electronic package 201 in FIG. 2B may be substantially similar to the electronic package 200 in FIG. 2A, with the exception that one or more extended RDL portions 221 may comprise one or more conductive contacts 232 and one or more conductive pillars 233. In some embodiments, the one or more extended RDL portions 221 may vertically extend from the top ends of the conductive contacts 232 to the bottom ends of the conductive pillars 233. Accordingly, such extended RDL portions 221 may have a thickness and exposed sidewall surfaces that enable increased solder joint reliability and enlarged electrical connections for package shielding architectures (or the like). Also, in the illustrated embodiment, the electrical contact 232 and conductive pillar 233 are shown to be disposed together in only one of the extended RDL portions 221. However, it is to be appreciated that embodiments may include electrical contacts 232 and conductive pillars 233 that are disposed in any number of extended RDL portions 221.

Figure 2C:
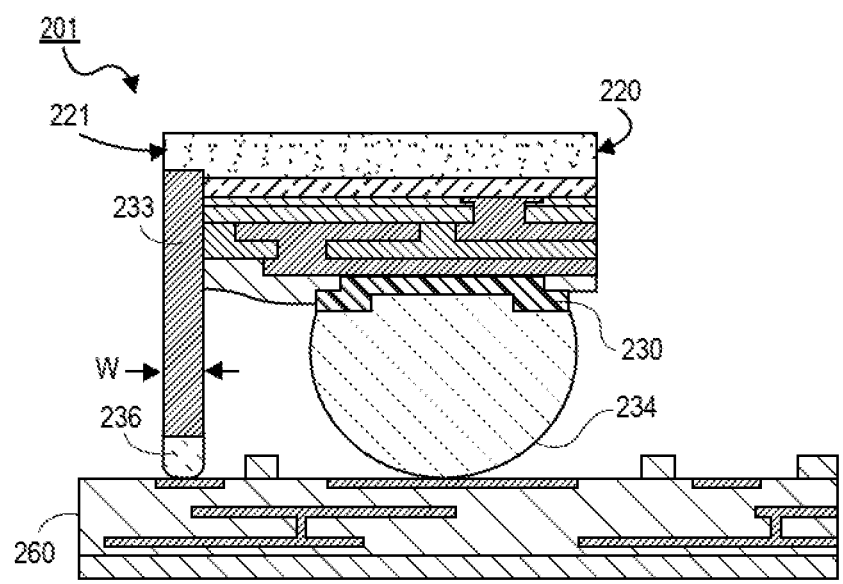
FIG. 2C is a zoomed in portion of a cross-sectional illustration of an electronic package comprising a package substrate, a RDL, and an extended RDL portion with a conductive pillar that is electrically coupled to the package substrate, in accordance with an embodiment.

Referring now to FIG. 2C, a cross-sectional illustration of a zoomed in portion of FIG. 2C after the conductive pillars 233 of the extended RDL portion 221 are electrically coupled to a package substrate 260 is shown, in accordance with an embodiment. That is, in the illustrated embodiment, the conductive pillar 233 may be electrically coupled to the package substrate 260 (e.g., a PCB, an interposer, or the like) by solder bumps 236. Whereas, the conductive layer 230 of the RDL 220 may be electrically coupled to the package substrate 260 by solder balls 234. The conductive pillars 233 may have a width W. In an embodiment, the width W may be less than approximately 100 μm. In an embodiment, the width W may be equal to or less than approximately 50 μm.

Figure 2D:
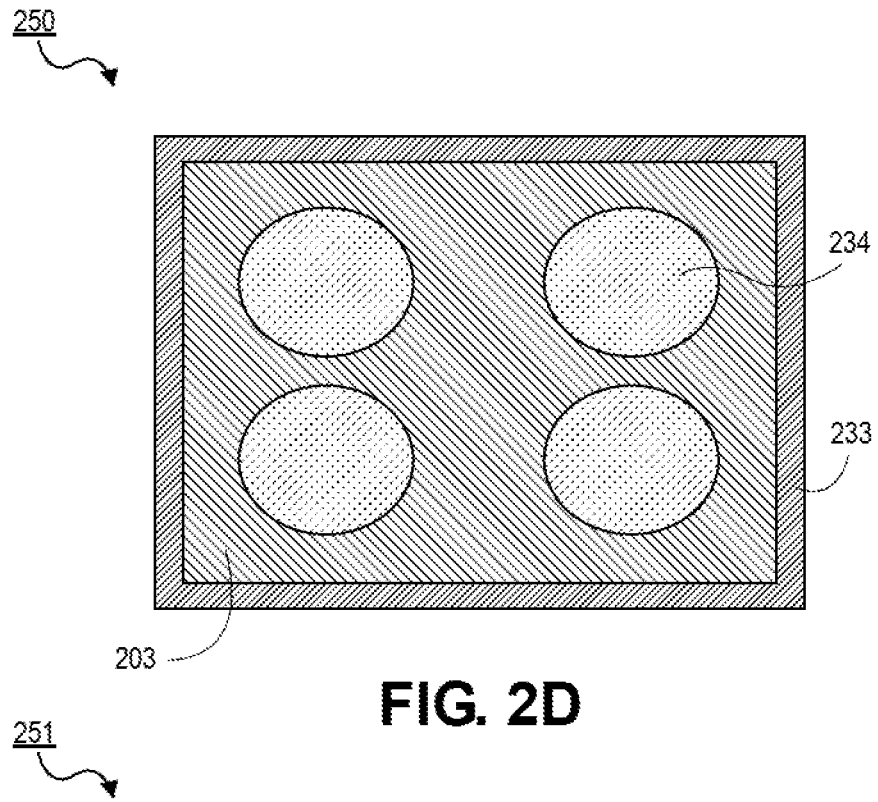
FIG. 2D is a plan view illustration of an electronic package comprising a die, a RDL, and an extended RDL portion with a conductive ring, in accordance with an embodiment.
Figure 2E:
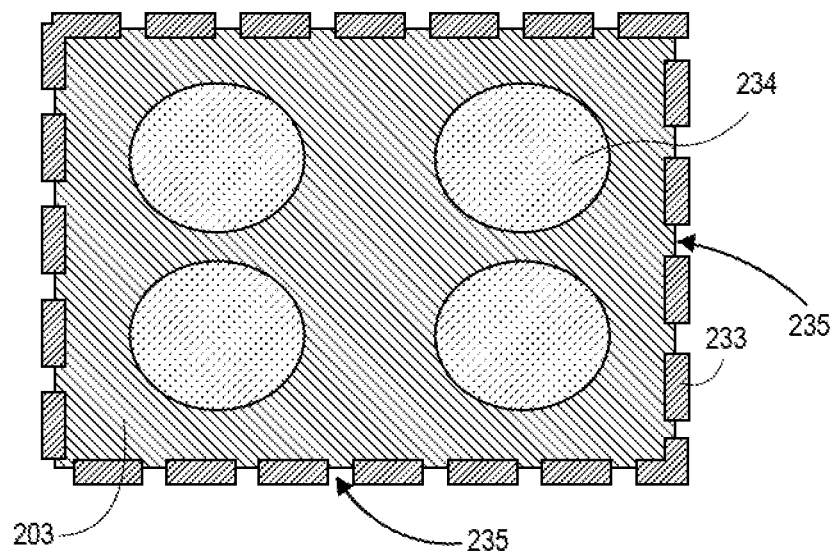
FIG. 2E is a plan view illustration of an electronic package comprising a die, a RDL, and an extended RDL portion with a plurality of conductive pillars, in accordance with an embodiment.

Referring now to FIGS. 2D-2E, a series of plan illustrations from the bottom views of the electronic packages 250-251 are shown, in accordance with additional embodiments. In some embodiments, the electronic packages 250-251 in FIGS. 2D-2E may be substantially similar to at least one of the electronic packages 200-201 in FIGS. 2A-2B, with the exception that a conductive ring 233 is used in FIG. 2D, and that a plurality of conductive pillars 233 are used in FIG. 2E. As such, the conductive ring and pillars 233 in FIGS. 2D-2E may be substantially similar to the conductive pillars 233 in FIG. 2A-2B.

That is, in the embodiments of FIGS. 2A-2B, the conductive pillars 233 may be patterned on the outer periphery regions of the RDL 220 (i.e., the extend RDL portions 221) to form one or more conductive interconnects such as the conductive ring shown in FIG. 2D, the conductive pillars shown in FIG. 2E, or the like. In the illustrated embodiments in FIG. 2D, the conductive ring 233 may be a single, continuous conductive interconnect that entirely surrounds the dielectric 203 and solder balls 234. Whereas, in the illustrated embodiments in FIG. 2E, the conductive pillars 233 may be conductive interconnects spaced apart with gaps 235 that collectively surround the dielectric 203 and solder balls 234.

Additionally, in some embodiments described herein, the conductive interconnects include conductive contacts, pillars, traces, and/or so on that may be disposed on predetermined regions on the sidewall surfaces of the dies and spaced apart from each other by gap spacings (e.g., as shown with the conductive interconnects in FIG. 2D). Nevertheless, in other embodiments described herein, any of the conductive interconnects may also be disposed on the sidewall surfaces of the dies to surround the entire width/length of such sidewall surfaces of the dies (e.g., as shown with the conductive interconnects in FIG. 2E). Accordingly, such conductive interconnects described herein in the extended RDL portions provide increased support to the electronic packages to substantially reduce any thermo-mechanical stresses and stresses related to coefficient of thermal expansion (CTE) mismatches between the electronic packages and boards (or package substrates). For example, these conductive interconnects enable electronic packages to have increased reliability in harsh conditions (e.g., −40/125° C., −55/125° C., and so on) that are generally experienced in the automotive industry or the like. Additionally, such embodiments of the conductive interconnects allow the electronic packages to be substantially smaller, since the support solder balls (e.g., solder balls 234 in FIGS. 2D-2E) not critical to function (NC) may not be needed.

Figure 3A:
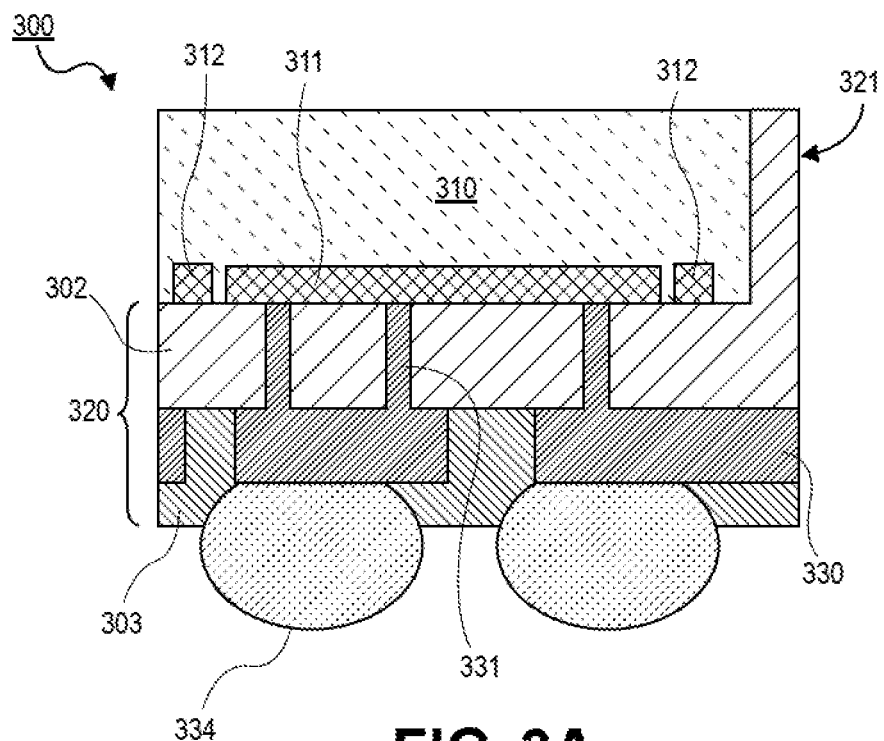
FIG. 3A is a cross-sectional illustration of an electronic package comprising a die, a RDL, and an extended RDL portion, in accordance with an embodiment.

Referring now to FIG. 3A, a cross-sectional illustration of an electronic package 300 is shown, in accordance with an additional embodiment. In an embodiment, the electronic package 300 in FIG. 3A may be substantially similar to the electronic package 200 in FIG. 2A, with the exception that the dielectric layer 302 in the extended RDL portions 321 vertically extends from the bottom surface of the dielectric layer 302 to the top surface of the die 310, without the need for trench regions. Accordingly, the die 310 with the active region 311 and crack stop component 312, and the RDL 320 with the conductive layer 330, vias 331, dielectric layers 302-303, extended RDL portions 321, and solder balls 334 in FIG. 3A may be substantially similar to the die 210 with the active region 211 and crack stop component 212, and the RDL 220 with the conductive layer 230, vias 231, dielectric layers 202-203, extended RDL portions 221, and solder balls 234 in FIG. 2A.

In the illustrated embodiment, the dielectric layer 302 in the extended RDL portions 321 may have substantially vertical sidewall profiles. However, it is to be appreciated that the dielectric layer 302 in the extended RDL portions 321 may have tapered sidewall profiles or any other desired profiles. As noted above, in an embodiment, the extended RDL portions 321 may have a top surface that is substantially coplanar to the top surface of the die 310. In some embodiments, the extended RDL portions 321 with the dielectric layer 302 may entirely cover each of the sidewall surfaces of the die 310. While, in other embodiments, the extended RDL portions 321 with the dielectric layer 302 may partially cover each of the sidewall surfaces of the die 310.

Figure 3B:
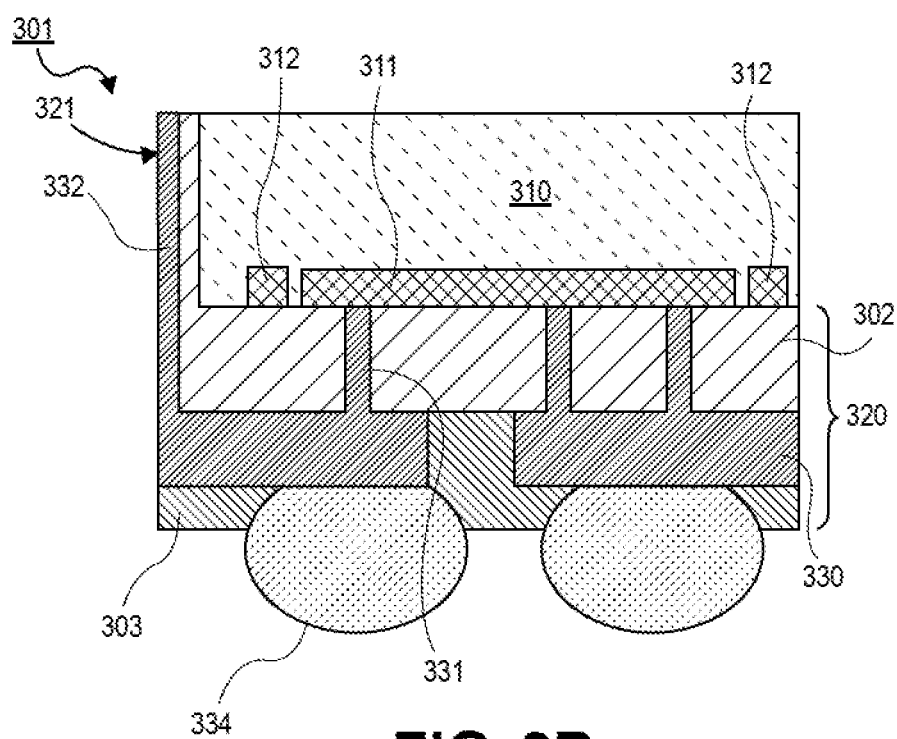
FIG. 3B is a cross-sectional illustration of an electronic package comprising a die, a RDL, and an extended RDL portion with conductive traces, in accordance with an embodiment.

Referring now to FIG. 3B, a cross-sectional illustration of an electronic package 301 is shown, in accordance with an additional embodiment. In an embodiment, the electronic package 301 in FIG. 3B may be substantially similar to the electronic package 301 in FIG. 3A, with the exception that the conductive traces 332 in the extended RDL portions 321 vertically extend from the top surface of the conductive layer 330 to the top surface of the die 310, and also surround the dielectric layer 302 in the extended RDL portions 321. For example, the conductive traces 332 and dielectric layer 302 of the extended RDL portions 321 may both have a top surface that is substantially coplanar to the top surface of the die 310. In some embodiments, the extended RDL portions 321 with the conductive traces 332 may entirely cover each of the sidewall surfaces of the dielectric layer 302 in the extended RDL portions 321. While, in other embodiments the extended RDL portions 321 with the conductive traces 332 may partially cover each of the sidewall surfaces of the dielectric layer 302 in the extended RDL portions 321. Also, in some embodiments, the conductive traces 332 may be disposed on predetermined positions on the sidewall surfaces of the die 310 (and spaced apart from each other with predetermined gap spacings (not shown)). Whereas, in other embodiments, the conductive traces 332 may extend the entire width/length of the sidewall surfaces of the die 310.

Figure 3C:
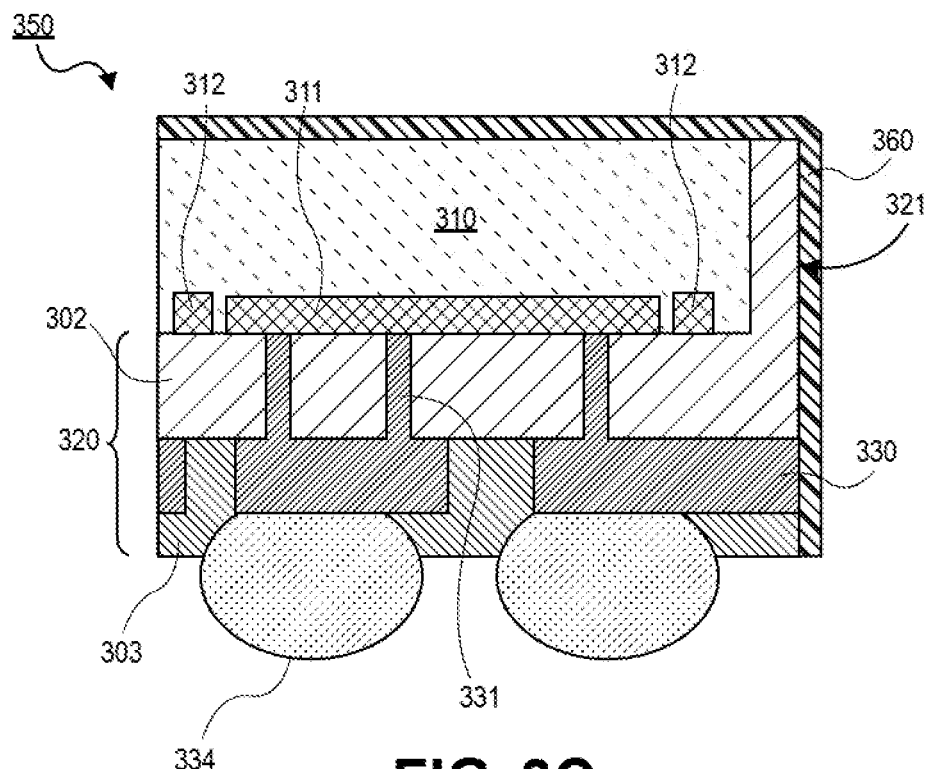
FIG. 3C is a cross-sectional illustration of an electronic package comprising a die, a RDL, an extended RDL portion, and a conductive shield, in accordance with an embodiment.

Referring now to FIG. 3C, a cross-sectional illustration of an electronic package 350 is shown, in accordance with an additional embodiment. In an embodiment, the electronic package 350 in FIG. 3C may be substantially similar to the electronic package 300 in FIG. 3A, with the exception that the conductive shield 360 is electrically coupled to the exposed sidewall surfaces of the conductive layer 330, and that the conductive shield 360 embeds the extended RDL portions 321 and the die 310. For example, the conductive shield 360 may be directly disposed over and around the outer sidewall surfaces of the extended RDL portions 321. Additionally, in an embodiment, the conductive shield 360 may be directly disposed on the top surfaces of the extended RDL portions 321 and die 310.

In some embodiments, the conductive shield 360 may be any type of packaging shield architectures. In an embodiment, the conductive shield 360 may comprise any conductive materials. For example, the conductive materials may comprise copper, aluminum, gold, nickel, titanium, silver, stainless steel, or the like. Additionally, in other embodiments, the conductive shield 360 may comprise a stack of conductive layers that are stacked on top of each other. In an embodiment, the conductive shields 360 may be implemented with a sputtering tool or the like.

Figure 3D:
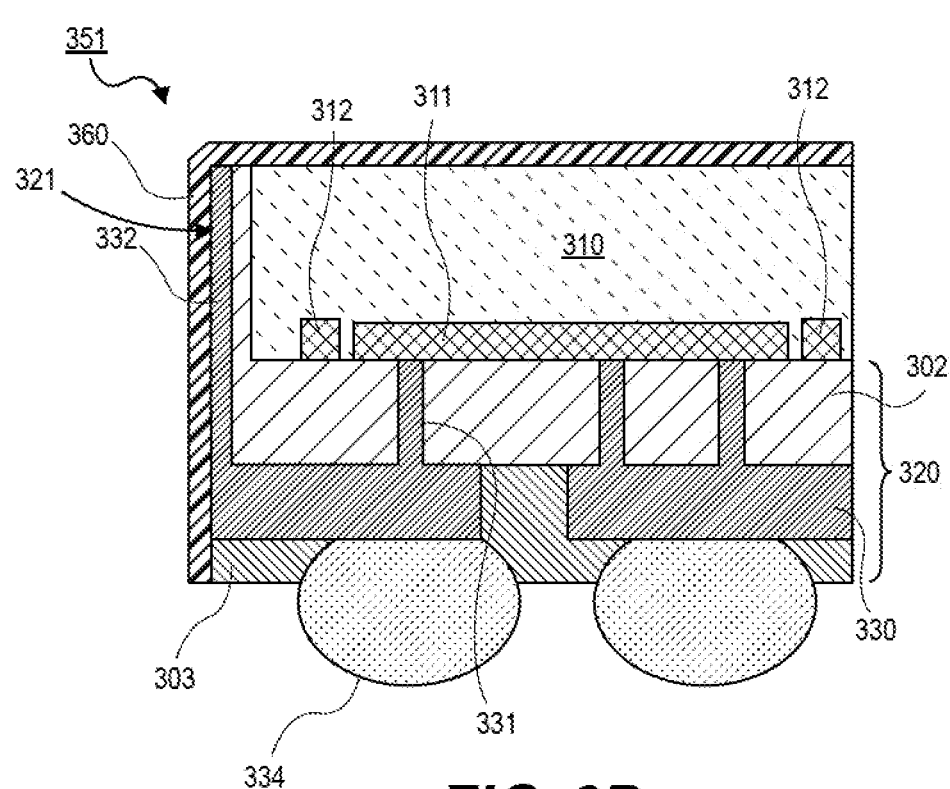
FIG. 3D is a cross-sectional illustration of an electronic package comprising a die, a RDL, an extended RDL portion with conductive traces, and a conductive shield, in accordance with an embodiment.

Referring now to FIG. 3D, a cross-sectional illustration of an electronic package 351 is shown, in accordance with an additional embodiment. In an embodiment, the electronic package 351 in FIG. 3D may be substantially similar to the electronic package 350 in FIG. 3C, with the exception that the conductive shield 360 is electrically coupled to the exposed sidewall surfaces of the conductive layer 330 and conductive traces 332, and that the conductive shield 360 embeds the extended RDL portions 321 and the die 310. For example, the conductive shield 360 may be directly disposed over and around the outer sidewall surfaces of the extended RDL portions 321. That is, as shown in the illustrated embodiment, the conductive shield 360 may be directly disposed on the outer sidewall surfaces of the dielectric layer 303 and the conductive layer 330 and conductive traces 332. Additionally, in some embodiments, the conductive shield 360 may be directly disposed on the top surfaces of the extended RDL portions 321 and die 310. That is, as shown in the illustrated embodiment, the conductive shield may be directly disposed on the top surfaces of the conductive traces 332, the dielectric layer 302, and the die 310.

Figure 4A:
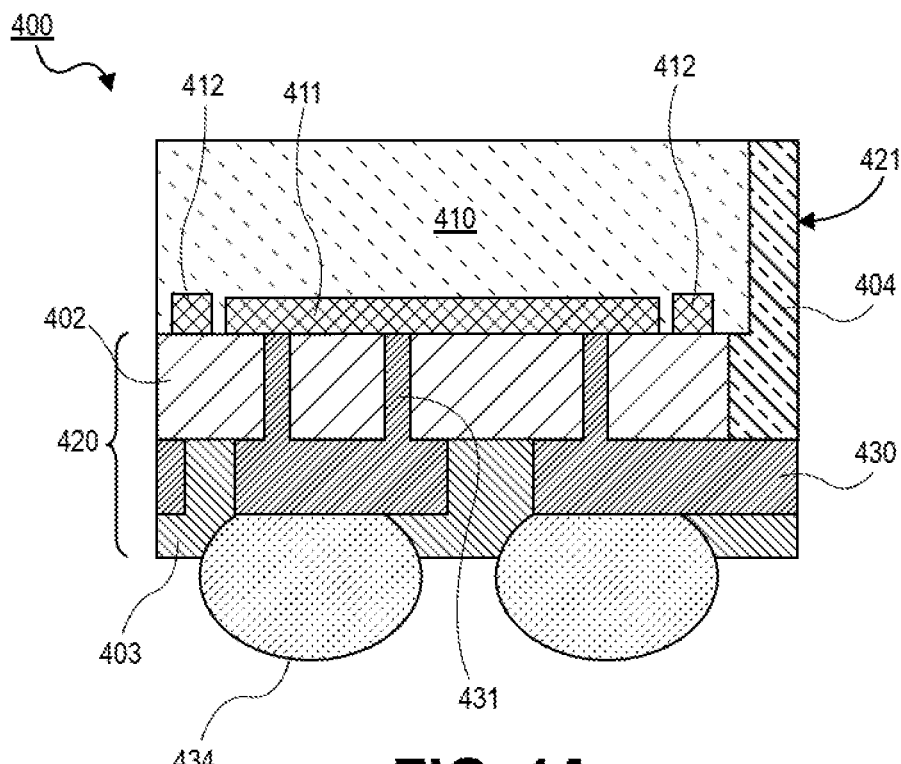
FIG. 4A is a cross-sectional illustration of an electronic package comprising a die, a RDL, and an extended RDL portion, in accordance with an embodiment.

Referring now to FIG. 4A, a cross-sectional illustration of an electronic package 400 is shown, in accordance with an additional embodiment. In an embodiment, the electronic package 400 in FIG. 4A may be substantially similar to the electronic package 300 in FIG. 3A, with the exception that the extended RDL portions 421 have a dielectric layer 404 disposed over and around the sidewall surfaces of the die 410, that the dielectric layer 404 is also disposed over the periphery region on the bottom surface of the die 110, and that the dielectric layer 404 is directly interfaced with the dielectric layer 402 in the RDL 420. Accordingly, the die 410 with the active region 411 and crack stop component 412, and the RDL 420 with the conductive layer 430, vias 431, dielectric layers 402-404, extended RDL portions 421, and solder balls 434 in FIG. 4A may be substantially similar to the die 310 with the active region 311 and crack stop component 312, and the RDL 320 with the conductive layer 330, vias 331, dielectric layers 302-203, extended RDL portions 321, and solder balls 334 in FIG. 3A.

In some embodiments, the dielectric layer 404 may comprise dielectric materials that are the same or different from dielectric materials of the dielectric layer 402 (and/or in some embodiments the dielectric layer 403). In an embodiment, when the dielectric layers 402 and 404 are comprised of different dielectric materials, the extended RDL portions 421 may comprise portions from the dielectric layer 403, the conductive layer 430, and the dielectric layer 404.

In the illustrated embodiment, the dielectric layer 404 may vertically extend from the bottom surface of the dielectric layer 404 (and/or the dielectric layer 402) to the top surface of the die 410. In such embodiments, the dielectric layer 404 may have substantially vertical sidewall profiles. However, it is to be appreciated that the dielectric layer 404 may have tapered sidewall profiles or any other desired profiles. As noted above, in an embodiment, the extended RDL portions 421 may have a top surface that is substantially coplanar to the top surface of the die 410. In some embodiments, the extended RDL portions 421 with the dielectric layer 404 may entirely cover each of the sidewall surfaces of the die 410. While, in other embodiments, the extended RDL portions 421 with the dielectric layer 404 may partially cover each of the sidewall surfaces of the die 410.

Figure 4B:
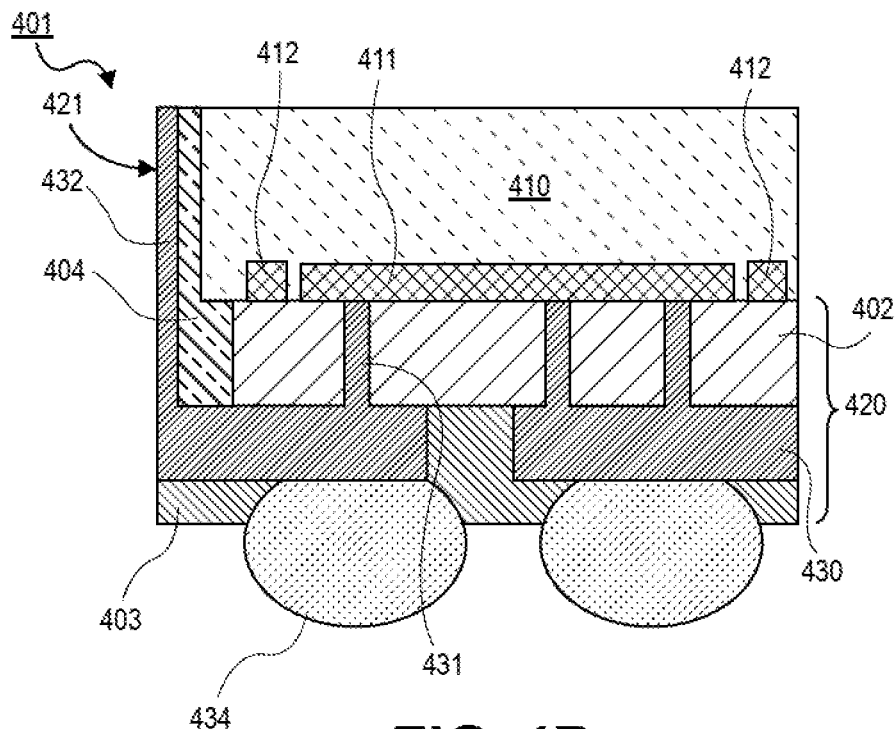
FIG. 4B is a cross-sectional illustration of an electronic package comprising a die, a RDL, and an extended RDL portion with conductive traces, in accordance with an embodiment.

Referring now to FIG. 4B, a cross-sectional illustration of an electronic package 401 is shown, in accordance with an additional embodiment. In an embodiment, the electronic package 401 in FIG. 4B may be substantially similar to the electronic package 401 in FIG. 4A, with the exception that the conductive traces 432 in the extended RDL portions 421 vertically extend from the top surface of the conductive layer 430 to the top surface of the die 410, and also surround the dielectric layer 404 in the extended RDL portions 421. For example, the conductive traces 432 and dielectric layer 404 of the extended RDL portions 421 may both have a top surface that is substantially coplanar to the top surface of the die 410. In some embodiments, the extended RDL portions 421 with the conductive traces 432 may entirely cover each of the sidewall surfaces of the dielectric layer 404 in the extended RDL portions 421. While, in other embodiments the extended RDL portions 421 with the conductive traces 432 may partially cover each of the sidewall surfaces of the dielectric layer 404 in the extended RDL portions 421.

Figure 4C:
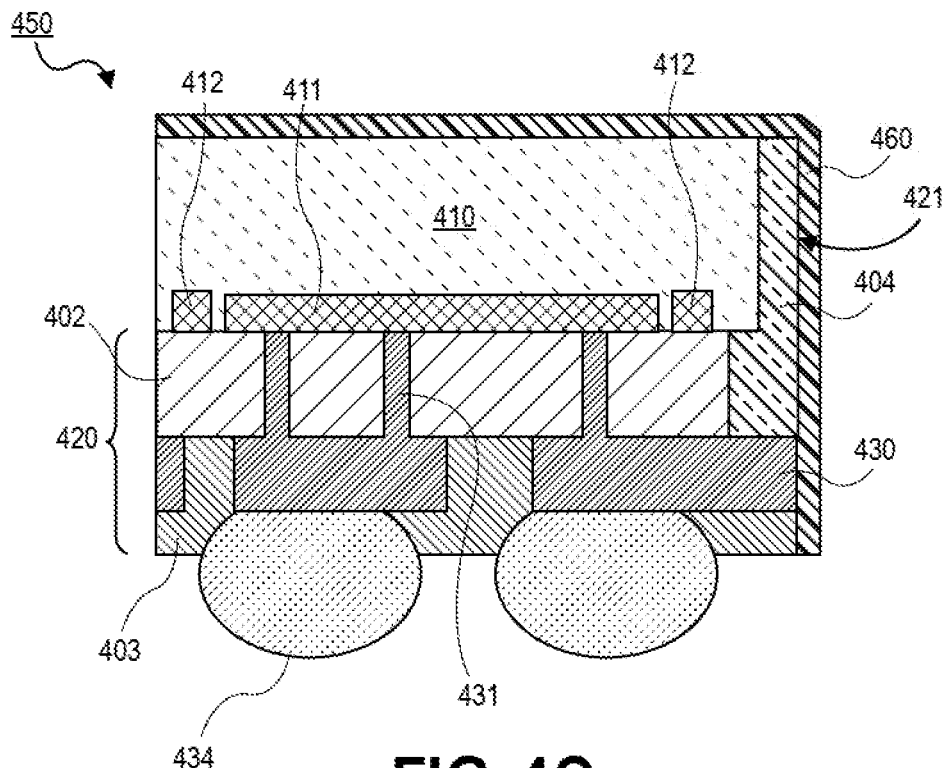
FIG. 4C is a cross-sectional illustration of an electronic package comprising a die, a RDL, an extended RDL portion, and a conductive shield, in accordance with an embodiment.

Referring now to FIG. 4C, a cross-sectional illustration of an electronic package 450 is shown, in accordance with an additional embodiment. In an embodiment, the electronic package 450 in FIG. 4C may be substantially similar to the electronic package 400 in FIG. 4A, with the exception that the conductive shield 460 is electrically coupled to the exposed sidewall surfaces of the conductive layer 430, and that the conductive shield 460 embeds the extended RDL portions 421 and the die 410. Particularly, for example, the conductive shield 460 may be directly disposed over and around the outer sidewall surfaces of the dielectric and conductive layers 403-404 and 430 of the extended RDL portions 421. Additionally, in an embodiment, the conductive shield 460 may be directly disposed on the top surfaces of the die 410 and dielectric layer 404 of the extended RDL portions 421. In an embodiment, the conductive shield 460 in FIG. 4C may be substantially similar to the conductive shield 360 in FIG. 3C.

Figure 4D:
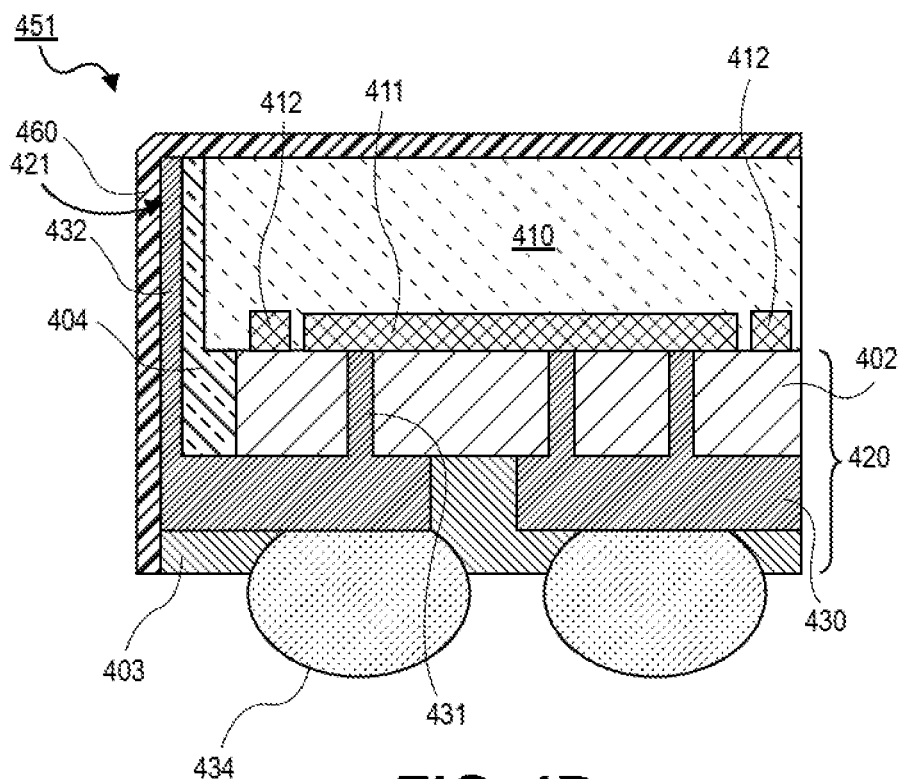
FIG. 4D is a cross-sectional illustration of an electronic package comprising a die, a RDL, an extended RDL portion with conductive traces, and a conductive shield, in accordance with an embodiment.

Referring now to FIG. 4D, a cross-sectional illustration of an electronic package 451 is shown, in accordance with an additional embodiment. In an embodiment, the electronic package 451 in FIG. 4D may be substantially similar to the electronic package 450 in FIG. 4C, with the exception that the conductive shield 460 is electrically coupled to the exposed sidewall surfaces of the conductive layer 430 and conductive traces 432, and that the conductive shield 460 embeds the extended RDL portions 421 and the die 410. For example, the conductive shield 460 may be directly disposed over and around the outer sidewall surfaces of the dielectric layer 403, conductive layer 430, and conductive traces 432 of the extended RDL portions 421. Additionally, in some embodiments, the conductive shield 460 may be directly disposed on the top surface of the die 410, and the top surfaces of the conductive traces 432 and dielectric layer 404 of the extended RDL portions 421.

Figure 5A:
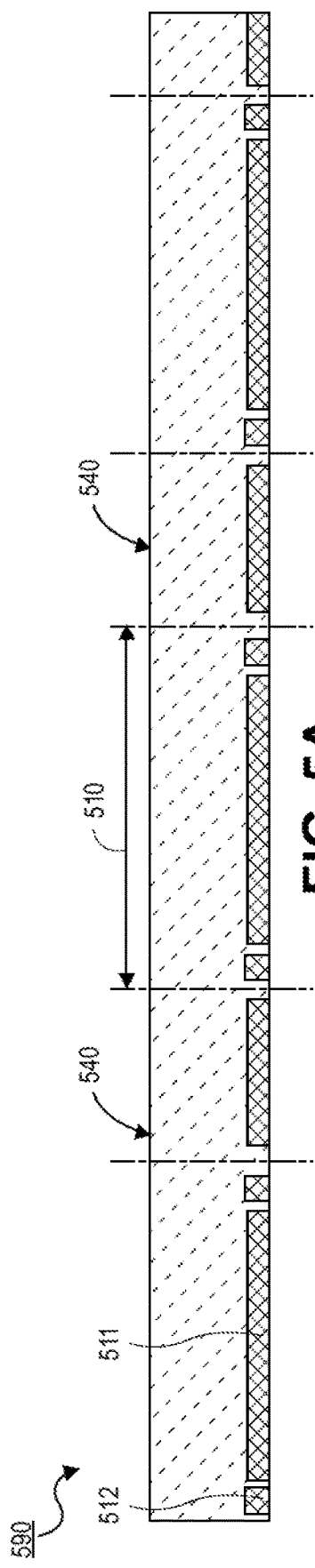
FIGS. 5A-5F are a series of cross-sectional illustrations that depict a process to implement one or more electronic packages with a die, a RDL, and an extended RDL portion having one or more conductive contacts, in accordance with some embodiments.
Figure 5B:
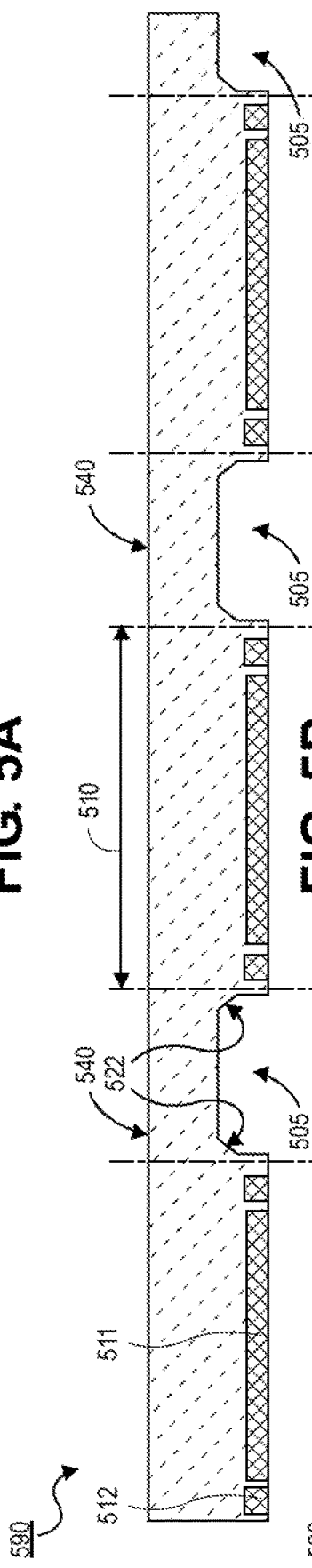
Figure 5C:
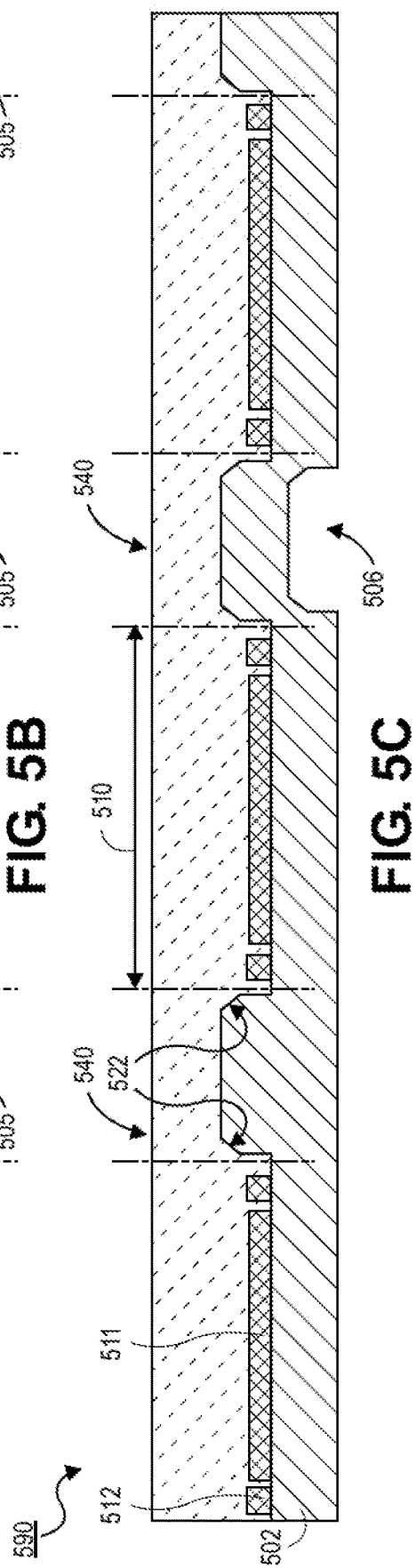
Figure 5D:
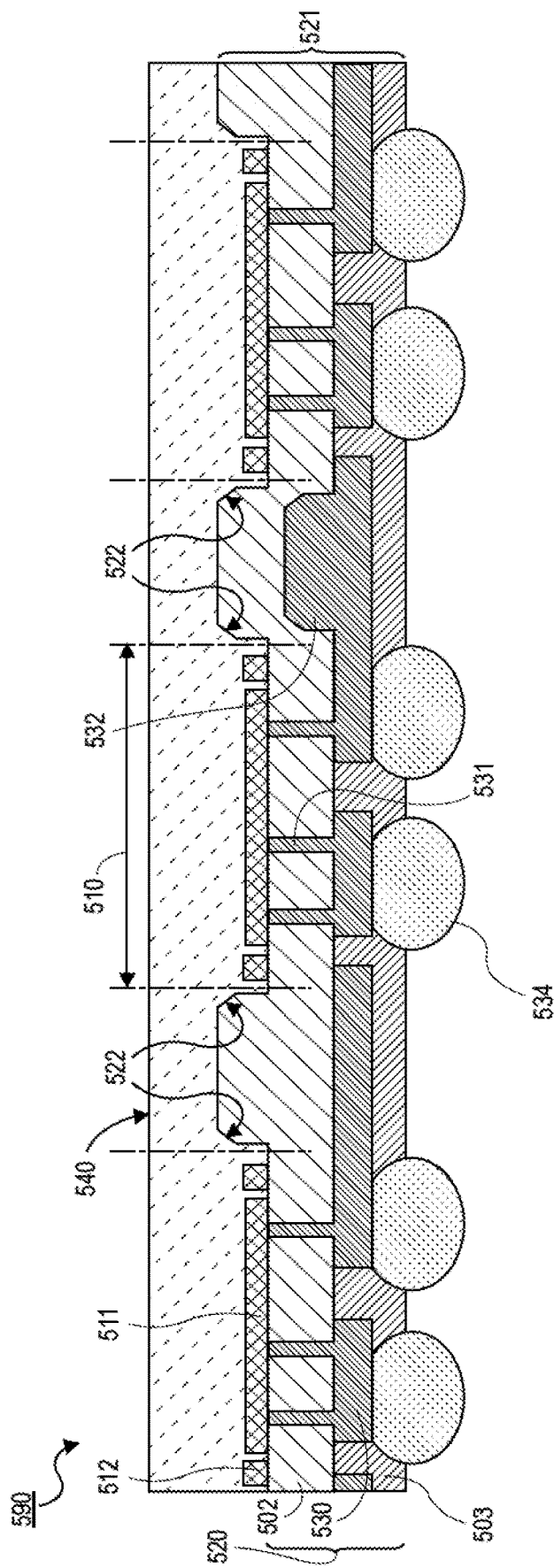
Figure 5E:
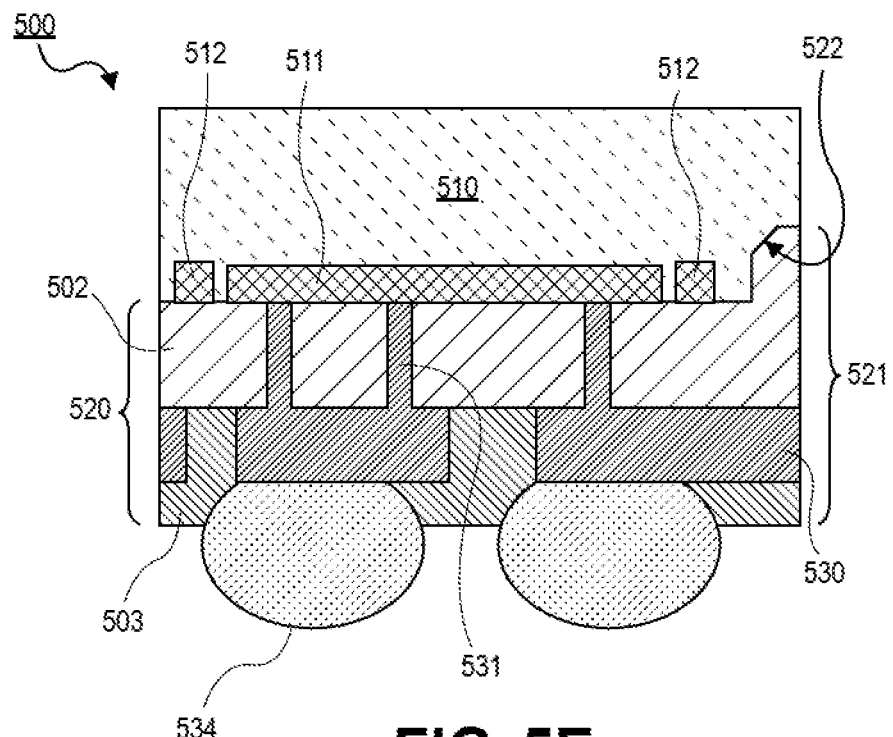

Referring now to FIGS. 5A-5F, a series of cross-sectional illustrations that depict a process for patterning a wafer 590 to form one or more electronic packages 500-501 is shown, in accordance with some embodiments. The electronic packages 500-501 in FIGS. 5D-5E are substantially similar to those illustrated and described with respect to the electronic packages 100-101 in FIGS. 1A-1B. However, it is to be appreciated that substantially similar electronic packages 500-501 may be implemented using structures (e.g., extended RDL portions) that are similar to any of the structures described above with respect to FIGS. 2A-2E, 3A-3D, and 4A-4D.

Referring now to FIG. 5A, a cross-sectional illustration of a wafer 590 is shown, in accordance with an embodiment. In some embodiments, the wafer 590 may be any suitable type of wafers. For example, the wafer 590 may be a bulk silicon wafer, a silicon-on-insulator (SOI) wafer, an engineered substrate with one or more semiconductor materials (e.g., crystalline silicon, amorphous silicon, polysilicon, etc.), and/or the like. In an embodiment, the wafer 590 may be grinded down to a predetermined thickness.

In some embodiments, the wafer 590 may comprise dies 510 and kerf regions 540. In the illustrated embodiments, each of the dies 510 may be formed from one of the wafer die regions (shown with dashed lines) in the wafer 590 that is spaced away from the other wafer die regions by the kerf regions 540. In an embodiment, each of the dies 510 may comprise an active region 511 and a crack stop component 512. In one embodiment, the kerf regions 540 may comprise process control monitor (PCM) regions or the like. In such embodiments, the active regions 511, the crack stop components 512, and the PCM regions are part of the BEOL region on the active surface of the wafer 590 that may be implemented by a BEOL process or the like.

Referring now to FIG. 5B, a cross-sectional illustration of the wafer 590 after trench openings 505 are formed is shown, in accordance with an embodiment. In an embodiment, the trench openings 505 may be patterned into the kerf regions 540 to form trench regions 522 on the sidewall surfaces of the dies 510. In some embodiments, the trench openings 505 may be implemented with a laser drillings process, a lithography process, or the like. In an embodiment, the trench openings 505 may be patterned with a thickness greater than a thickness of the BEOL region on the active surface of the wafer 590. In an embodiment, the trench regions 522 provide exposed sidewall surfaces around the active surfaces of the dies 510 that will be entirely filled with a subsequently disposed dielectric layer to protect the active regions 511 of the dies 510 (as shown below in FIG. 5C).

Referring now to FIG. 5C, a cross-sectional illustration of the wafer 590 after a dielectric layer 502 is disposed over and around the active regions 511, the crack stop components 512, and the trench regions 522 is shown, in accordance with an embodiment. In an embodiment, the dielectric layer 502 may be a laminated layer or deposited with any other suitable process. The dielectric layer 502 may be a buildup film, a solder resist layer (e.g., a solder mask), a PID, an epoxy material, or any other dielectric materials. In an embodiment, the dielectric layer 502 is disposed over the entire active surface and kerf regions 540 of the wafer 590 with a predetermined thickness, wherein the dielectric layer 505 disposed into the trench openings form dielectric trenches (or dielectric-filled trenches) in the kerf regions 540.

In some embodiments, the dielectric layer 502 may be patterned to form openings 506 within footprints of one or more kerf regions 540. In an embodiment, the openings 506 may be positioned substantially within a footprint of the initial trench openings that were formed in the active surface of the wafer 590 (as shown in FIG. 5B). In an embodiment, the openings 506 may be implemented with a laser drillings process, a lithography process, or the like. Note that the openings 506 may be omitted (if needed) based on the desired packaging design.

Referring now to FIG. 5D, a cross-sectional illustration of the wafer 590 after a RDL 520 with extended RDL portions 521 are formed is shown, in accordance with an embodiment. In an embodiment, the RDL 520 may also comprise a dielectric layer 503, a conductive layer 530, vias 531, and conductive contacts 532. In some embodiments, conductive material may be disposed over the dielectric layer 502, the previously patterned openings (as shown in FIG. 5C), and via openings (e.g., with laser drilling) (not shown) to respectively form the conductive layer 530, the conductive contacts 532, and the vias 531. For example, the conductive material may be bare copper or the like. While one conductive layer 530 is shown in FIG. 5D, it is to be appreciated that embodiments may include any number of conductive layers 530.

In an embodiment, the dielectric layer 503 may be disposed over and around the conductive layer 530. In some embodiments, the dielectric layer 503 may be the same as or different from the dielectric layer 502. Solder balls 534 may then be directly coupled to the conductive layer 530. As described herein, the RDL 520 has the extended RDL portions 521 that may be implemented over and around the trench regions 522 on the sidewall surfaces of the dies 510. Additionally, in some embodiments, one or more of the extended RDL portions 521 may comprise the conductive contacts 532 that will have exposed sidewall surfaces after a subsequent singulated process (as shown in FIGS. 5E-5F).

Figure 5F:
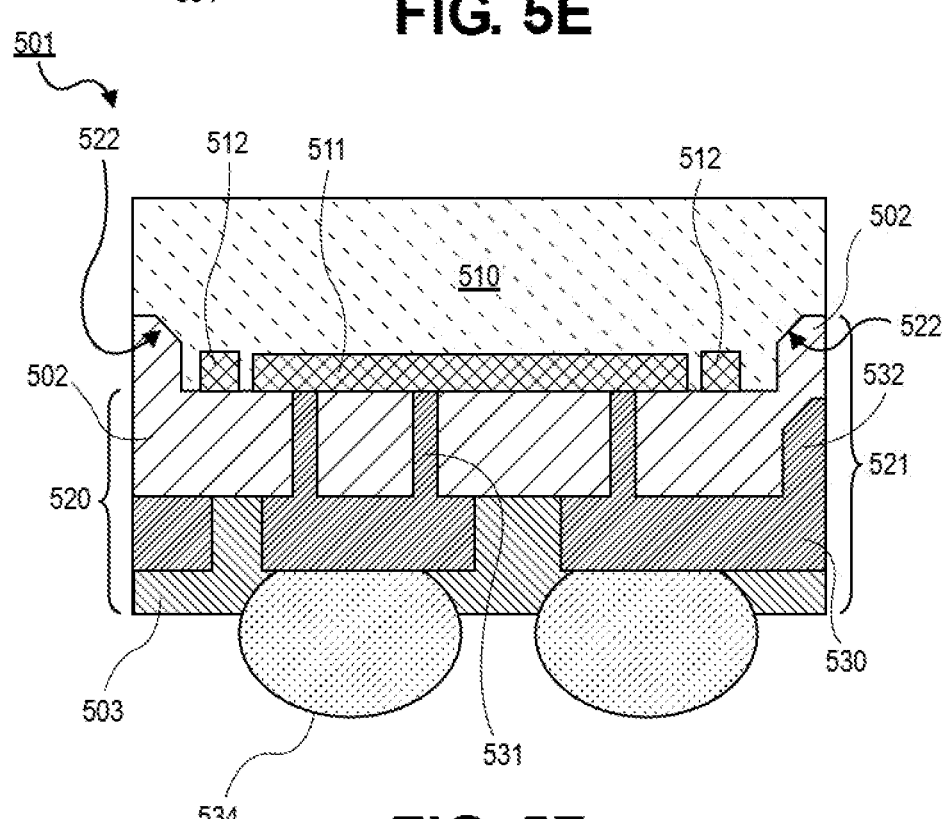

Referring now to FIG. 5E-5F, cross-sectional illustrations of electronic packages 500-501 after the wafer is singulated are shown, in accordance with some embodiments. That is, after the RDL 520 is implemented, the wafer may be singulated with a singulation process (e.g., a lasering process, a dicing process, etc.) that removes the kerf regions fully or partially to thereby implement the singulated electronic packages 500-501 with the extended RDL portions 521. Accordingly, as described in the embodiment above, the extended RDL portions 521 may, therefore, be used to protect the trench regions 522 and active regions 511 of the dies 510. Additionally, in other embodiments, the extended RDL portions 521 may also comprise vertically extended dielectric layers and/or conductive contacts, traces, pillars, and/or shields.

Referring now to FIGS. 6A-6B, a series of cross-sectional illustrations that depict a process for patterning a wafer 690 to form one or more electronic packages 600-601 and 604 is shown, in accordance with some embodiments. The electronic packages 600-601 and 604 in FIG. 6B are similar to those illustrated and described with respect to the electronic packages 500-501 in FIGS. 5E-5F.

Particularly, in the illustrated embodiments below, the structures of the wafer 690 starting at FIG. 6A is similar to the structures of the wafer 590 shown in FIG. 5D, with the exception that extended RDL portions 621 may further comprise conductive pillars 633. However, it is to be appreciated that substantially similar electronic packages 600-601 and 604 may be implemented using structures that are similar to any of the structures described above with respect to FIGS. 1A-1B, 2A-2E, 3A-3D, and 4A-4D.

Referring now to FIG. 6A a cross-sectional illustration of the wafer 690 after a RDL 620 with extended RDL portions 621 are formed is shown, in accordance with an embodiment. As noted above, the RDL 620 with the extended RDL portions 621 disposed in the wafer 690 in FIG. 6A is substantially similar to the RDL 520 with the extended RDL portions 521 that are disposed in the wafer 590 in FIG. 5D, with the exception that one or more conductive plating processes may be implemented to dispose conductive pillars 633 onto the conductive layer 630. Accordingly, the dies 610 with the active regions 611, crack stop components 612, and trench regions 622, the RDL 620 with the conductive layer 630, vias 631, dielectric layers 602-603, and extended RDL portions 621 with the conductive contacts 632, the kerf regions 640, and the solder balls 634 in FIG. 6A may be substantially similar to the dies 510 with the active regions 511, crack stop components 512, and trench regions 522, and the RDL 520 with the conductive layer 530, vias 531, dielectric layers 502-503, and extended RDL portions 521 with the conductive contacts 532, the kerf regions 540, and the solder balls 534 in FIG. 5D.

In an embodiment, the extended RDL portions 621 may comprise both the conductive contacts and pillars 632-633 and/or one of the conductive contacts and pillars 632-633. In an embodiment, the conductive pillars 633 may be implemented with the same process implemented for the conductive layer 630 and the conductive contacts 632, such as a lithography process or the like. In some embodiments, the conductive pillars 633 may have any thickness based on the desired packaging design. For example, the conductive pillars 633 may have a thickness that may be substantially defined between the bottom surface of the conductive layer 630 and a top surface of a subsequently coupled substrate (e.g., a PCB, an interposer, etc.).

Referring now to FIG. 6B, cross-sectional illustrations of electronic packages 600-601 and 604 after the wafer is singulated are shown, in accordance with some embodiments. That is, after the RDL 620 is implemented, the wafer may be singulated with a singulation process that removes the kerf regions fully or partially to thereby implement the singulated electronic packages 600-601 and 604 with the respective extended RDL portions 621. Accordingly, the electronic packages 600-601 and 604 in FIG. 6B are similar to the electronic packages 500-501 in FIGS. 5E-5F, with the exception that the extended RDL portions 621 comprise both or one of the conductive contacts and pillars 632-633.

Figure 7D:
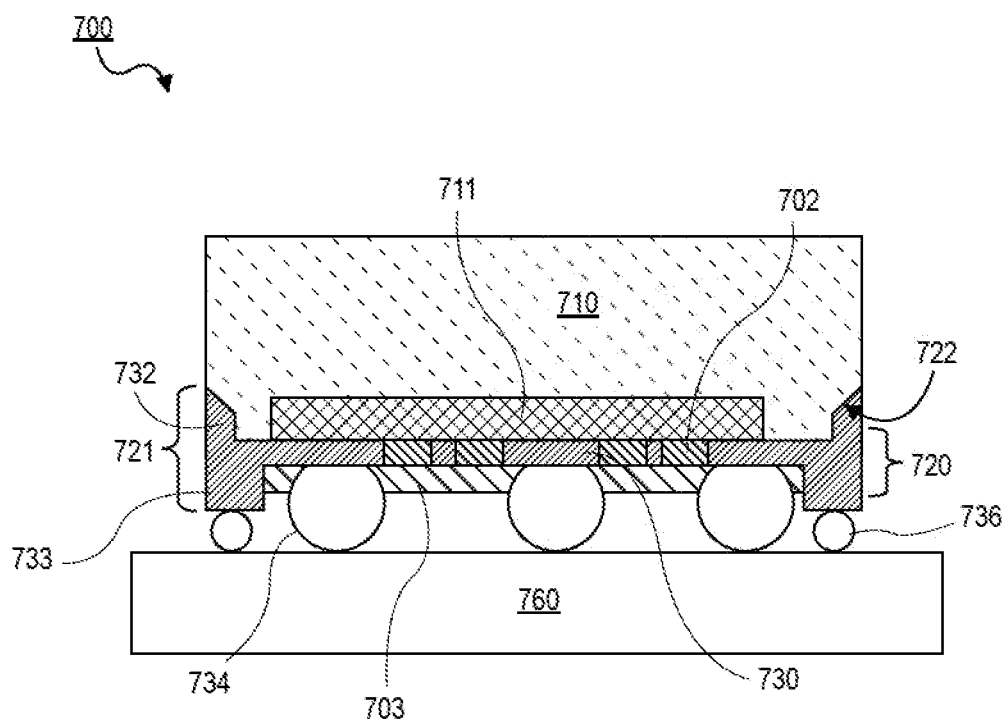

Referring now to FIGS. 7A-7D, a series of cross-sectional illustrations that depict a process for patterning a wafer 790 to form an electronic package 700 is shown, in accordance with some embodiments. The electronic package 700 in FIG. 7D is similar to those illustrated and described with respect to the electronic packages 100-101 in FIGS. 1A-1B, with the exception that the extended RDL portions 721 use conductive material (e.g., copper) to fill the trench regions 722 of the dies 710. That is, whereas the extended RDL portions 121 use the dielectric layer 102 to fill the trench regions 122 of the dies 110 in FIGS. 1A-1B, the extended RDL portions 721 may use the conductive layer 730 to fill the trench regions 722 of the dies 710 as shown below in FIG. 7D.

In FIGS. 7A-7D, the wafer 790 and the electronic package 700 include the dies 710 with the active regions 711 and trench regions 722, the RDL 720 with the conductive layer 730, dielectric layers 702-703, and extended RDL portions 721 with the conductive contacts and pillars 732-733, the kerf regions 740, and the solder balls 734 that are similar to those illustrated and described above with respect to FIGS. 1A-1B, 2A-2E, 3A-3D, 4A-4D, 5A-5F, and 6A-6B.

Referring now to FIG. 7A, a cross-sectional illustration of the wafer 790 after trench openings 705 are formed is shown, in accordance with an embodiment. In an embodiment, the trench openings 705 may be patterned into the kerf regions 740 to form trench regions 722 on the sidewall surfaces of the dies 710.

Referring now to FIG. 7B, a cross-sectional illustration of the wafer 790 after a conductive layer 730 and a dielectric layer 702 are disposed over and around the active regions 711 and the trench regions 722 is shown, in accordance with an embodiment. In an embodiment, the conductive layer 730 is disposed directly on the bottom surface and trench regions 722 of the dies 710. In an embodiment, the conductive layer 730 may be implemented with a lithography process or any other suitable plating process. In an embodiment, the conductive layer 730 is disposed over the active surface and kerf regions 740 of the wafer 790 with a predetermined thickness. That said, in the illustrated embodiment, the initial trench openings may be partially filled by the predetermined thickness of the conductive layer 730.

Thereafter, in an embodiment, openings (not shown) may be patterned into the conductive layer 730 with any suitable patterning process. In some embodiments, the dielectric layer 702 is disposed into the patterned openings in the conductive layer 730, and disposed over the conductive layer 730 in the kerf regions 740 to completely fill the initial trench openings. In an embodiment, the dielectric layer 702 may have a surface that is substantially coplanar to a surface of the conductive layer 730.

Referring now to FIG. 7C, a cross-sectional illustration of the wafer 790 after a RDL 720 with extended RDL portions 721 are formed is shown, in accordance with an embodiment. The structures in FIG. 7C may be similar to the structures shown in FIG. 6A, with the exceptions that the conductive layer 730 is directly disposed on (and electrically coupled to) the active regions 711 of the dies 710 without the need of any vias (based on the desired packaging design), and that the initial trench openings in the kerf regions 740 are filled respectively with the conductive layer 730, the dielectric layer 702, and then the dielectric layer 703. In some embodiments, the extended RDL portions 721 may include portions of the conductive layer 730 and conductive contacts and pillars 732-733 without the need of any dielectric materials.

Referring now to FIG. 7D, a cross-sectional illustration of an electronic package 700 electrically coupled to a package substrate 760 after the wafer is singulated is shown, in accordance with an embodiment. For example, after the RDL 720 is implemented, the wafer may be singulated with a singulation process that removes the kerf regions fully or partially to thereby implement the singulated electronic package 700 with the extended RDL portions 721. In an embodiment, the singulated electronic package 700 may then be electrically coupled to the package substrate 760 with solder bumps 736. In some embodiments, the package substrate 760 may be any type of packaging substrates. For example, the package substrate 760 may be a PCB, an interposer, or the like. Additionally, as described above, the conductive pillars 733 may be disposed and positioned over and around the outer sidewall surfaces of the die 710 to form a conductive ring or one or more conductive pillars that are spaced apart from each other with slight gaps (e.g., as shown in the embodiments in FIGS. 2D-2E).

Figure 8C:
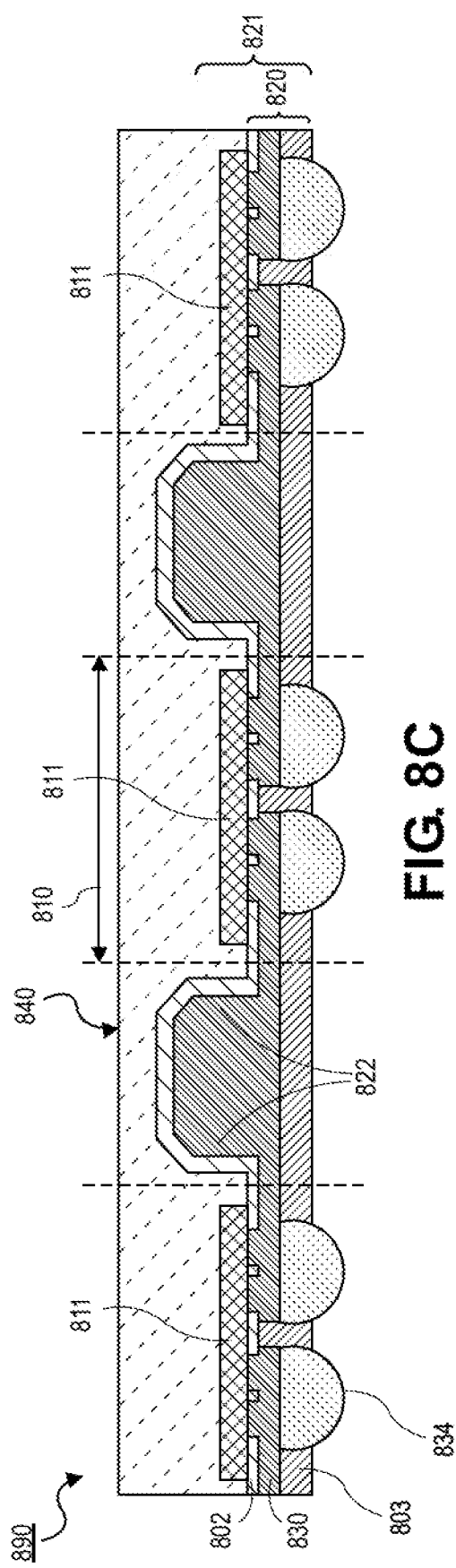
Figure 8D:
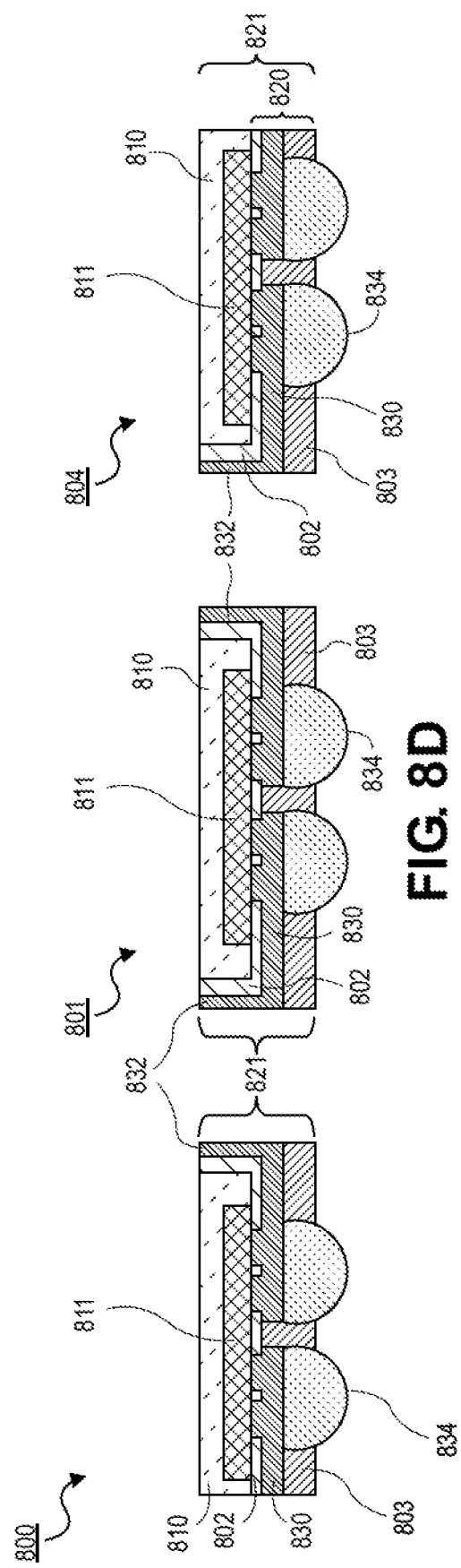

Referring now to FIGS. 8A-8D, a series of cross-sectional illustrations that depict a process for patterning a wafer 890 to form one or more electronic packages 800-801 and 804 is shown, in accordance with some embodiments. The structures of the electronic packages 800-801 and 804 in FIG. 8D are similar to those structures illustrated and described with respect to the electronic package 700 in FIG. 7D, with the exception that the extended RDL portions 821 have conductive traces 832 and portions of the dielectric layer 802 that entirely surround the sidewall surfaces of the dies 810. That is, as shown in FIG. 8D, the extended RDL portions 821 are comprised of a portion of the dielectric layer 802 that directly surrounds the entire thickness of the sidewall surfaces of the dies 810, and the conductive traces 832 that directly surround the entire thickness of the outer sidewall surfaces of the respective portion of the dielectric layer 802.

In FIGS. 8A-8D, the wafer 890 and the electronic packages 800-801 and 804 include the dies 810 with the active regions 811, the RDL 820 with the conductive layer 830, dielectric layers 802-803, and extended RDL portions 821 with the conductive traces 832, the kerf regions 840, and the solder balls 834 that are similar to those illustrated and described above with respect to FIGS. 7A-7D.

Referring now to FIG. 8A, a cross-sectional illustration of the wafer 890 after trench openings 805 are formed is shown, in accordance with an embodiment. In an embodiment, the trench openings 805 may be patterned into the kerf regions 840 to expose the entire sidewall surfaces of the dies 810.

Referring now to FIG. 8B, a cross-sectional illustration of the wafer 890 after a dielectric layer 802 and a conductive layer 830 are disposed over and around the active regions 811 and the trench regions 822 is shown, in accordance with an embodiment. In an embodiment, the dielectric layer 802 is disposed directly on the bottom and sidewall surfaces of the dies 810. In an embodiment, the dielectric layer 802 is disposed over the active surface and kerf regions 840 of the wafer 890 with a predetermined thickness. That said, in the illustrated embodiment, the initial trench openings may be partially filled by the predetermined thickness of the dielectric layer 802.

Thereafter, in an embodiment, openings (not shown) may be patterned into the dielectric layer 802 with any suitable patterning process. In some embodiments, the conductive layer 830 is disposed into the patterned openings in the dielectric layer 802, and disposed over the dielectric layer 802 on the active side of the dies 810 and in the kerf regions 840 to completely fill the initial trench openings. In an embodiment, the conductive layer 830 may have a bottommost surface that is exposed and optionally grinded down (or polished).

Referring now to FIG. 8C, a cross-sectional illustration of the wafer 890 after a RDL 820 with extended RDL portions 821 are formed is shown, in accordance with an embodiment. The structures in FIG. 8C may be similar to the structures shown in FIG. 7C, with the exceptions that the initial trench openings in the kerf regions 840 are filled respectively with the dielectric layer 802 and then conductive layer 830, and that both the dielectric layer 802 and conductive layer 830 entirely surround the entire sidewall surfaces of the dies 810.

Referring now to FIG. 8D, cross-sectional illustrations of one or more electronic packages 800-801 and 804 after the wafer is singulated is shown, in accordance with an embodiment. For example, after the RDL 820 is implemented, the wafer may be singulated with a singulation process that removes the kerf regions fully or partially to thereby implement the singulated electronic packages 800-801 and 804 with the extended RDL portions 821. Accordingly, as shown in the illustrated embodiments, the dies 810 may have top surfaces that are substantially coplanar to top surfaces of the conductive traces 832 and the portions of the dielectric layer 802 of the extended RDL portions 821.

Figure 9:
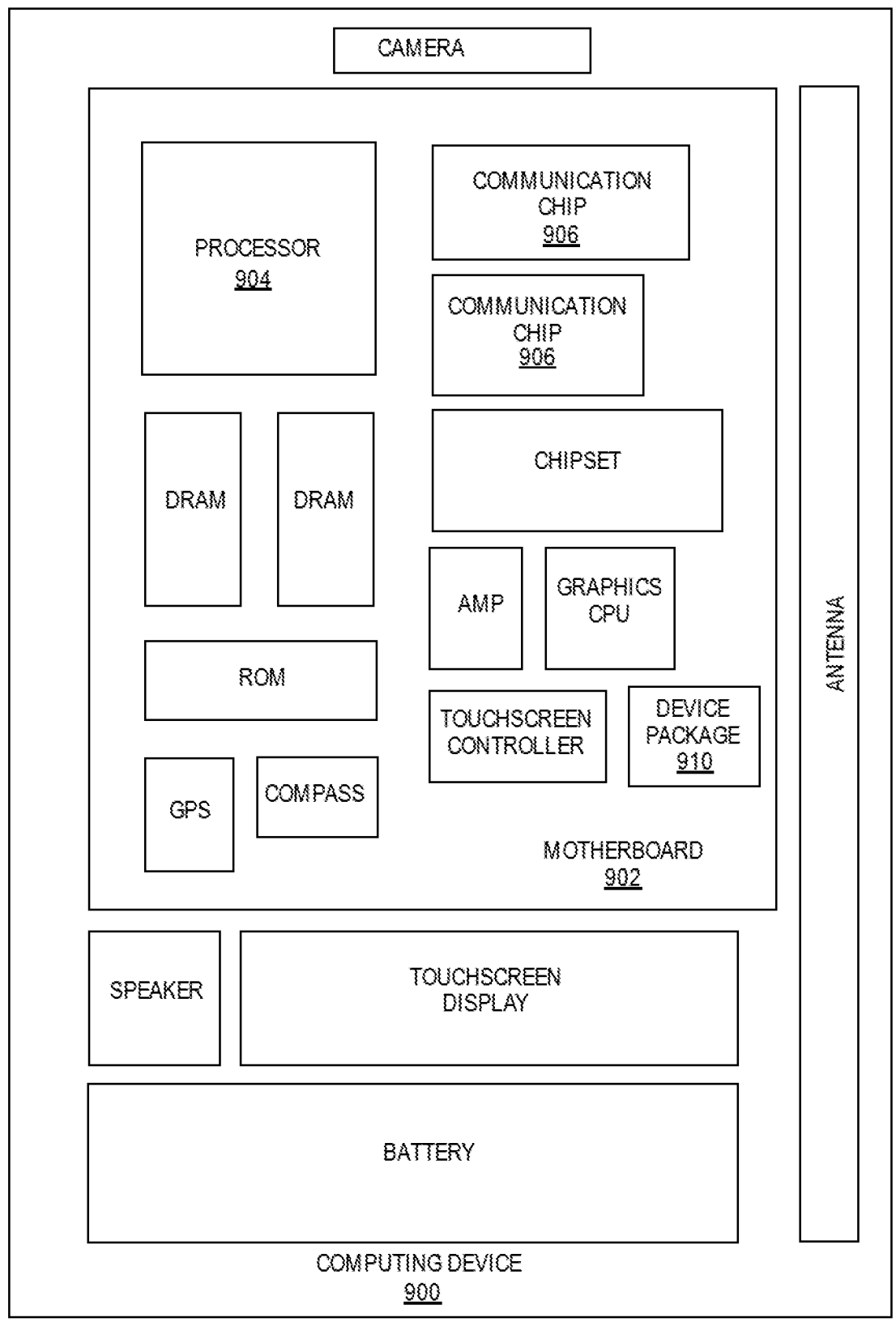
FIG. 9 is a schematic of a computing device with an electronic package with a die, a RDL, and an extended RDL portion with conductive interconnects, in accordance with an embodiment.

FIG. 9 illustrates a computing device 900 in accordance with one implementation of the embodiments described herein. FIG. 9 illustrates an example of computing device 900. Computing device 900 houses a motherboard 902. Motherboard 902 may include a number of components, including but not limited to processor 904, device package 910 (or electronic package), and at least one communication chip 906. Processor 904 is physically and electrically coupled to motherboard 902. For some embodiments, at least one communication chip 906 is also physically and electrically coupled to motherboard 902. For other embodiments, at least one communication chip 906 is part of processor 904.

Depending on its applications, computing device 900 may include other components that may or may not be physically and electrically coupled to motherboard 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 906 enables wireless communications for the transfer of data to and from computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 906 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

Processor 904 of computing device 900 includes an integrated circuit die packaged within processor 904. The term "processor" may refer to any device or portion of a device that processes electronic data from registers and/or memory to transform that electronic data into other electronic data that may be stored in registers and/or memory. Device package 910 may be an electronic package such as a wafer level package or the like. In one embodiment, device package 910 may be substantially similar to any of the electronic packages described and illustrated in FIGS. 1A-1B, 2A-2E, 3A-3D, 4A-4D, 5A-5F. Accordingly, device package 910 may include any of the structures of the extended RDL portions described and illustrated herein—or any other components from the figures described herein.

Note that device package 910 may be a single component/device, a subset of components, and/or an entire system, as the materials, features, and components may be limited to device package 910 and/or any other component of the computing device 900 that may need any of the structures of the extended RDL portions described herein (e.g., the motherboard 902, the processor 904, the communication chips 906, and/or any other component of the computing device 900 that may need the embodiments described herein).

At least one communication chip 906 also includes an integrated circuit die packaged within the communication chip 906. For some embodiments, the integrated circuit die of the communication chip 906 may be packaged with one or more devices on an electronic package that has extended RDL portions as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1: an electronic package, comprising: a RDL over a package substrate, wherein the RDL comprises: a conductive layer in a first dielectric layer; a second dielectric layer over the conductive layer and the first dielectric layer; and an extended portion of the RDL having a first thickness, wherein the first thickness vertically extends from a bottom surface of the first dielectric layer to a topmost surface of the second dielectric layer; and a die on the RDL, wherein the die has a plurality of sidewall surfaces, a top surface, and a bottom surface that is opposite from the top surface, wherein the die has an active region that is on the bottom surface of the die, wherein the first thickness is greater than a second thickness of the RDL that vertically extends from the bottom surface of the first dielectric layer to the bottom surface of the die, wherein the extended portion is over and around a first region of the bottom surface and a second region of the sidewall surfaces, and wherein the active region has a top surface that is located below the topmost surface of the second dielectric layer.

Example 2: the electronic package of Example 1, further comprising a plurality of vias in the RDL, wherein the vias electrically couple the conductive layer to the active region.

Example 3: the electronic package of Examples 1-2, wherein the extended portion comprises portions of the first dielectric layer, the conductive layer, and the second dielectric layer.

Example 4: the electronic package of Examples 1-3, wherein the second region is a trench-shaped region on the sidewall surfaces of the die, wherein the trench-shaped region directly interfaces with the first region on the bottom surface of the die, and wherein the trench-shaped region on each of the sidewall surfaces is directly surrounded by the extended portion of the RDL.

Example 5: the electronic package of Examples 1-4, wherein the trench-shaped region is directly surrounded by the portion of the second dielectric layer of the extended portion, wherein the portion of the conductive layer has an exposed sidewall surface, and wherein the portion of the second dielectric layer has an exposed sidewall surface that is substantially coplanar to the sidewall surfaces of the die and to the exposed sidewall surface of the portion of the conductive layer.

Example 6: the electronic package of Examples 1-5, further comprising: a crack stop structure on the bottom surface of the die, wherein the active region is surrounded by the crack stop structure; and a plurality of solder balls electrically couple the RDL to the package substrate.

Example 7: the electronic package of Examples 1-6, wherein the first dielectric layer comprises one or more first dielectric materials, wherein the second dielectric layer comprises one or more second dielectric materials, and wherein the first dielectric materials are the same as or different from the second dielectric materials.

Example 8: the electronic package of Examples 1-7, wherein the trench-shaped region has a thickness that is greater than a thickness of the active region, and wherein the topmost surface of the second dielectric layer of the extended portion directly interfaces with a topmost surface of the trench-shaped region.

Example 9: the electronic package of Examples 1-8, further comprising: one or more conductive contacts in the extended portion of the RDL, wherein the one or more conductive contacts is directly on the portion of the conductive layer, and wherein each conductive contact has an exposed sidewall surface that is substantially coplanar to the exposed sidewall surface of the portion of the conductive layer.

Example 10: A method of forming an electronic package, comprising: forming a plurality of trench openings into a first surface of a substrate; disposing a first dielectric layer over the trench openings and the first surface of the substrate; disposing a conductive layer over the first dielectric layer; disposing a second dielectric layer over the conductive layer and the first dielectric layer to form a RDL, wherein the RDL comprises the conductive layer and the first and second dielectric layers; and removing regions of the substrate that are located over the trench openings to singulate the substrate into a plurality of electronic packages, wherein each of the regions vertically extends from a surface of the RDL to a second surface of the substrate that is opposite from the first surface, and wherein each of the singulated electronic packages comprises: an extended portion of the RDL having a first thickness, wherein the first thickness vertically extends from a bottom surface of the second dielectric layer to a topmost surface of the first dielectric layer; and a die over the RDL and the extended portion, wherein the die has a plurality of sidewall surfaces, a top surface, and a bottom surface that is opposite from the top surface, wherein the die has an active region that is on the bottom surface of the die, wherein the first thickness is greater than a second thickness of the RDL that vertically extends from the bottom surface of the second dielectric layer to the bottom surface of the die, wherein the extended portion is over and around a first region of the bottom surface and a second region of the sidewall surfaces, and wherein the active region has a top surface that is located below the topmost surface of the first dielectric layer.

Example 11: the method of Example 10, further comprising: disposing a plurality of vias into the first dielectric layer of the RDL, wherein the vias electrically couple the conductive layer to the active region.

Example 12: the method of Examples 10-11, wherein the extended portion comprises portions of the first dielectric layer, the conductive layer, and the second dielectric layer.

Example 13: the method of Examples 10-12, wherein the second region is a trench-shaped region on the sidewall surfaces of the die, wherein the trench-shaped region directly interfaces with the first region on the bottom surface of the die, and wherein the trench-shaped region on each of the sidewall surfaces is directly surrounded by the extended portion of the RDL.

Example 14: the electronic package of Examples 10-13, wherein the trench-shaped region is directly surrounded by the portion of the first dielectric layer of the extended portion, wherein the portion of the conductive layer has an exposed sidewall surface, and wherein the portion of the first dielectric layer has an exposed sidewall surface that is substantially coplanar to the sidewall surfaces of the die and to the exposed sidewall surface of the portion of the conductive layer.

Example 15: the electronic package of Examples 10-14, further comprising: disposing a crack stop structure on the bottom surface of the die, wherein the active region is surrounded by the crack stop structure; and electrically coupling the RDL to a package substrate by a plurality of solder ball.

Example 16: the method of Examples 10-15, wherein the first dielectric layer comprises one or more first dielectric materials, wherein the second dielectric layer comprises one or more second dielectric materials, and wherein the first dielectric materials are the same as or different from the second dielectric materials.

Example 17: the method of Examples 10-16, wherein the trench-shaped region has a thickness that is greater than a thickness of the active region, and wherein the topmost surface of the first dielectric layer of the extended portion directly interfaces with a topmost surface of the trench-shaped region.

Example 18: the method of Examples 10-17, further comprising: one or more conductive contacts in the extended portion of the RDL, wherein the one or more conductive contacts is directly on the portion of the conductive layer, and wherein each conductive contact has an exposed sidewall surface that is substantially coplanar to the exposed sidewall surface of the portion of the conductive layer.

Example 19: an electronic package, comprising: a package substrate; a redistribution layer (RDL) electrically coupled to the package substrate; and a die electrically coupled to the package substrate by the RDL, wherein the die has a plurality of sidewall surfaces, a top surface, and a bottom surface that is opposite from the top surface, wherein the die has an active region that is on the bottom surface of the die, and wherein the RDL comprises: a conductive layer in a first dielectric layer; a second dielectric layer over the conductive layer and the first dielectric layer; a plurality of vias in the second dielectric layer, wherein the vias electrically couple the conductive layer to the active region; and an extended portion of the RDL having a first thickness, wherein the first thickness vertically extends from a bottom surface of the first dielectric layer to a topmost surface of the second dielectric layer, wherein the first thickness is greater than a second thickness of the RDL that vertically extends from the bottom surface of the first dielectric layer to the bottom surface of the die, wherein the extended portion is over and around a region of the bottom surface and a trench-shaped region of the sidewall surfaces, wherein the active region has a top surface that is located below the topmost surface of the second dielectric layer, wherein the extended portion comprises portions of the first dielectric layer, the conductive layer, and the second dielectric layer, wherein the portion of the conductive layer has an exposed sidewall surface, wherein conductive contacts are directly on the portion of the conductive layer of the extended portion, and wherein each conductive contact has an exposed sidewall surface that is substantially coplanar to the exposed sidewall surface of the portion of the conductive layer.

Example 20: the electronic package of Example 19, wherein the trench-shaped region directly interfaces with the region on the bottom surface of the die, and wherein the trench-shaped region on each of the sidewall surfaces is directly surrounded by the extended portion of the RDL.

Example 21: the electronic package of Examples 19-20, wherein the trench-shaped region is directly surrounded by the portion of the second dielectric layer of the extended portion, and wherein the portion of the second dielectric layer has an exposed sidewall surface that is substantially coplanar to the sidewall surfaces of the die and to the exposed sidewall surface of the portion of the conductive layer.

Example 22: the electronic package of Examples 19-21, further comprising: a crack stop structure on the bottom surface of the die, wherein the active region is surrounded by the crack stop structure; a plurality of solder balls electrically couple the RDL to a first region on a top surface of the package substrate; and a conductive interconnect electrically couples the portion of the conductive layer to a second region on the top surface of the package substrate, wherein the conductive interconnect has an exposed sidewall surface that is substantially coplanar to the exposed sidewall surface of the portion of the conductive layer, wherein the first region is entirely within a footprint of the second region, and wherein the conductive region comprises a conductive ring or a plurality of conductive pillars.

Example 23: the electronic package of Examples 19-22, wherein the first dielectric layer comprises one or more first dielectric materials, wherein the second dielectric layer comprises one or more second dielectric materials, and wherein the first dielectric materials are the same as or different from the second dielectric materials.

Example 24: the electronic package of Examples 19-23, wherein the trench-shaped region has a thickness that is greater than a thickness of the active region, and wherein the topmost surface of the second dielectric layer of the extended portion directly interfaces with a topmost surface of the trench-shaped region.

Example 25: the electronic package of Examples 19-24, further comprising: a conductive shield electrically coupled to the exposed surface of the portion of the conductive layer or one or more of the exposed surfaces of the conductive contacts, wherein the conductive shield is over and around the top and sidewall surfaces of the die.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. An electronic package, comprising:
    a redistribution layer (RDL) over a package substrate, wherein the RDL comprises:
        a conductive layer in a first dielectric layer, the first dielectric layer having a lateral width;
        a second dielectric layer over the conductive layer and the first dielectric layer; and
        an extended portion of the RDL having a first thickness, wherein the first thickness vertically extends from a bottom surface of the first dielectric layer to a topmost surface of the second dielectric layer; and
    a die on the RDL, wherein the die has a plurality of sidewall surfaces, a top surface, and a bottom surface that is opposite from the top surface, the die having a trench-shaped region with a tapered sidewall profile joining a vertical portion and a horizontal portion at one of the sidewall surfaces, and the die having a lateral width the same as the lateral width of the first dielectric layer, wherein the die has an active region that is located on the bottom surface of the die, wherein the RDL electrically couples the active region to the package substrate, wherein the first thickness is greater than a second thickness of the RDL that vertically extends from the bottom surface of the first dielectric layer to the bottom surface of the die, and wherein the extended portion is over and around a first region of the bottom surface of the die and a second region of the sidewall surfaces of the die including in the trench-shaped region and on the tapered sidewall profile, on the vertical portion and on the horizontal portion at the one of the sidewall surfaces.

2. The electronic package of claim 1, further comprising:
    a plurality of vias in the second dielectric layer, wherein the vias electrically couple the conductive layer to the active region.

3. The electronic package of claim 1, wherein the active region has a top surface that is located below the topmost surface of the first dielectric layer, and wherein the extended portion comprises portions of the first dielectric layer, the conductive layer, and the second dielectric layer.

4. The electronic package of claim 3, wherein the trench-shaped region directly interfaces with the first region on the bottom surface of the die, wherein the first region is a periphery region on the bottom surface of the die, and wherein the trench-shaped region on each of the sidewall surfaces is directly surrounded by the extended portion of the RDL.

5. The electronic package of claim 4, wherein the trench-shaped region is directly surrounded by the portion of the second dielectric layer of the extended portion, wherein the portion of the conductive layer has an exposed sidewall surface, and wherein the portion of the second dielectric layer has an exposed sidewall surface that is substantially coplanar to the sidewall surfaces of the die and to the exposed sidewall surface of the portion of the conductive layer.

6. The electronic package of claim 5, wherein the trench-shaped region has a thickness that is greater than a thickness of the active region, and wherein the topmost surface of the second dielectric layer of the extended portion directly interfaces with a topmost surface of the trench-shaped region.

7. The electronic package of claim 5, further comprising:
    one or more conductive contacts in the extended portion of the RDL, wherein the one or more conductive contacts are directly on the portion of the conductive layer, and wherein each conductive contact has an exposed sidewall surface that is substantially coplanar to the exposed sidewall surface of the portion of the conductive layer.

8. The electronic package of claim 1, further comprising:
    a crack stop structure on the bottom surface of the die, wherein the active region is surrounded by the crack stop structure; and
    a plurality of solder balls electrically couple the RDL to the package substrate.

9. The electronic package of claim 1, wherein the first dielectric layer comprises one or more first dielectric materials, wherein the second dielectric layer comprises one or more second dielectric materials, and wherein the first dielectric materials are the same as or different from the second dielectric materials.

10. An electronic package, comprising:
    a package substrate;
    a redistribution layer (RDL) electrically coupled to the package substrate; and
    a die electrically coupled to the package substrate by the RDL, wherein the die has a plurality of sidewall surfaces, a top surface, and a bottom surface that is opposite from the top surface, the die having a trench-shaped region with a tapered sidewall profile joining a vertical portion and a horizontal portion at one of the sidewall surfaces, and the die having a lateral width, wherein the die has an active region that is on the bottom surface of the die, and wherein the RDL comprises:
- a conductive layer in a first dielectric layer, the first dielectric layer having a lateral width the same as the lateral width of the die;
- a second dielectric layer over the conductive layer and the first dielectric layer;
- a plurality of vias in the second dielectric layer, wherein the vias electrically couple the conductive layer to the active region; and
- an extended portion of the RDL having a first thickness, wherein the first thickness vertically extends from a bottom surface of the first dielectric layer to a topmost surface of the second dielectric layer, wherein the first thickness is greater than a second thickness of the RDL that vertically extends from the bottom surface of the first dielectric layer to the bottom surface of the die, wherein the extended portion is over and around a region on the bottom surface of the die including in the trench-shaped region and on the tapered sidewall profile, on the vertical portion and on the horizontal portion at the one of the sidewall surfaces, wherein the active region has a top surface that is located below the topmost surface of the second dielectric layer, wherein the extended portion comprises one or more conductive contacts and one or more portions of the first dielectric layer, the conductive layer, and the second dielectric layer, wherein the conductive contacts are directly on the portion of the conductive layer, and wherein the conductive contacts have exposed sidewall surfaces that are substantially coplanar to exposed sidewall surfaces of the portion of the conductive layer.

11. The electronic package of claim 10, wherein the trench-shaped region directly interfaces with the region on the bottom surface of the die, wherein the region is a periphery region on the bottom surface of the die, and wherein the trench-shaped region on each of the sidewall surfaces is directly surrounded by the extended portion of the RDL.

12. The electronic package of claim 10, wherein the trench-shaped region is directly surrounded by the portion of the second dielectric layer of the extended portion, and wherein the portion of the second dielectric layer has exposed sidewall surfaces that are substantially coplanar to the sidewall surfaces of the die, the exposed sidewall surfaces of the conductive contacts, and the exposed sidewall surfaces of the portion of the conductive layer.

13. The electronic package of claim 10, further comprising:
- a crack stop structure on the bottom surface of the die, wherein the active region is surrounded by the crack stop structure;
- a plurality of solder balls electrically couple the RDL to a first region that is located on a top surface of the package substrate; and
- a conductive interconnect electrically couples the extended portion to a second region that is located on the top surface of the package substrate, wherein the conductive interconnect has one or more exposed sidewall surfaces that are substantially coplanar to the exposed sidewall surfaces of the portion of the conductive layer, wherein the first region is entirely within a footprint of the second region, and wherein the conductive interconnect comprises a conductive ring or a plurality of conductive pillars.

14. The electronic package of claim 13, further comprising:
- a conductive shield electrically coupled to the two or more of the exposed sidewall surfaces of the portion of the conductive layer or the exposed sidewall surfaces of the conductive contacts, wherein the conductive shield is over and around the top surface and sidewall surfaces of the die.

15. The electronic package of claim 10, wherein the first dielectric layer comprises one or more first dielectric materials, wherein the second dielectric layer comprises one or more second dielectric materials, and wherein the first dielectric materials are the same as or different from the second dielectric materials.

16. The electronic package of claim 10, wherein the trench-shaped region has a thickness that is greater than a thickness of the active region, and wherein the topmost surface of the second dielectric layer of the extended portion directly interfaces with a topmost surface of the trench-shaped region.

* * * * *